(12) United States Patent
Wyar et al.

(10) Patent No.: US 8,222,906 B2
(45) Date of Patent: Jul. 17, 2012

(54) ADAPTIVE PULSE WIDTH TIME DOMAIN REFLECTOMETER

(76) Inventors: Paul Francis Wyar, Troutville, VA (US); John Garfield Williams, Roanoke, VA (US)

(*) Notice: Subject to any disclaimer, the term of this patent is extended or adjusted under 35 U.S.C. 154(b) by 504 days.

(21) Appl. No.: 12/488,157

(22) Filed: Jun. 19, 2009

(65) Prior Publication Data
US 2009/0315565 A1    Dec. 24, 2009

Related U.S. Application Data

(60) Provisional application No. 61/073,864, filed on Jun. 19, 2008.

(51) Int. Cl.
*G01R 31/11*    (2006.01)
(52) U.S. Cl. ........................................................ 324/533
(58) Field of Classification Search .................. 324/533
See application file for complete search history.

(56) References Cited

U.S. PATENT DOCUMENTS

| | | | |
|---|---|---|---|
| 4,970,466 A | 11/1990 | Bolles et al. ................ 324/533 |
| 5,069,544 A | 12/1991 | Buerli ......................... 356/73.1 |
| 5,155,439 A * | 10/1992 | Holmbo et al. ............. 324/534 |
| 6,097,755 A * | 8/2000 | Guenther et al. ............ 375/228 |
| 6,104,197 A | 8/2000 | Kochan ....................... 324/533 |
| 6,397,159 B1 | 5/2002 | Richardson ..................... 702/79 |
| 6,509,740 B1 | 1/2003 | Needle et al. ................ 324/533 |
| 6,653,844 B2 | 11/2003 | Wyar ............................ 324/533 |
| 6,714,021 B2 | 3/2004 | Williams ..................... 324/533 |
| 6,744,854 B2 | 6/2004 | Berrier et al. ............. 379/22.03 |
| 6,943,557 B2 * | 9/2005 | Wyar ............................ 324/533 |
| 7,116,111 B2 | 10/2006 | Wyar ............................ 324/533 |
| 7,337,079 B2 | 2/2008 | Park et al. ...................... 702/59 |
| 7,375,602 B2 * | 5/2008 | Flake et al. .................... 333/20 |
| 2004/0080323 A1 | 4/2004 | Bostoen et al. ............... 324/624 |
| 2004/0251912 A1 * | 12/2004 | Pharn et al. .................. 324/534 |

OTHER PUBLICATIONS

N. E. Hagar III, "Broadband time-domain-reflectrometry dielectric spectroscopy using variable-time-scale sampling", Review of Scientific Instruments vol. 65, No. 4, Apr. 1994, pp. 887 to 891.

* cited by examiner

*Primary Examiner* — Jeff Natalini
(74) *Attorney, Agent, or Firm* — Matthew A. Pequignot; Pequignot + Myers LLC

(57) ABSTRACT

An adaptive pulse width (APW) Time Domain Reflectometer (TDR) comprises an enhancement to the standard Pulse TDR by adjusting the effective pulse width as a function of time. Improved resolution for a large range of cable lengths is obtained, as well as allowing an all-in-one view of the processed return signal trace.

14 Claims, 25 Drawing Sheets

ADAPTIVE PULSE WIDTH TIME DOMAIN REFLECTOMETER

CROSS-REFERENCE TO RELATED APPLICATIONS

The present invention claims priority from U.S. Provisional Patent Application No. 61/073,864 filed Jun. 19, 2008, which is incorporated herein by reference for all purposes.

TECHNICAL FIELD

The present invention relates to a time domain reflectivity (TDR) method for diagnosing faults in transmission lines of a communication or telephone cable system, and presenting abnormalities on a suitable display for technical maintenance personnel.

BACKGROUND OF THE INVENTION

With the demand of higher speed internet access to the home, new technologies known as Digital Subscriber Line (DSL) have been invented. Communication lines or cables that work sufficiently well for standard telephone do not always work well for different types of DSL.

The communication cable can be any copper pair line for use in ISDN DSL (IDSL), Asymmetric DSL (ADSL), High bit rate DSL (HDSL), Symmetric DSL (SDSL), Single-Pair High-speed DSL (SHDSL), and (Very High Bitrate DSL (VDSL or VHDSL) communication systems, as well as all other DSL-type technologies (herein-after, "xDSL" indicating all the various DSL technologies and line codings).

A time domain reflectometer (TDR) can be used in locating transmission line faults. Time Domain reflectometers measure transmission line impedance and determine if there is any impedance discontinuity in the transmission line.

TDR testing typically involves a step voltage generator launching a fast edge through a resistor into a transmission line under investigation. Alternatively, a pulse generator may be used for launching a short pulse into the transmission line. The incident and reflected voltage waves are then monitored by a receiver, e.g. an oscilloscope, downstream from the resistor. This echoing technique reveals at a glance the characteristic impedance of the line under investigation in the time domain and shows the position and nature (e.g. high or low impedance) of each impedance discontinuity along the line under test. The location of each impedance discontinuity may be calculated from a time offset between the launch time of the pulse or a fast edge of the pulse and the arrival time of reflected pulses or pulse edges.

An impedance discontinuity often corresponds to a fault in the communication cable. The types of faults that a TDR can detect are most commonly associated with anomalies such as open circuits (opens), short circuits (shorts), bridged-taps and wet sections.

As the transmission lines under investigation become longer, electrical signal loss in the line increases so that it becomes increasingly harder to detect such anomalies. In most cases it takes considerable training and practice for a telephone technician to discriminate between the various anomalies. In order to locate them, even the most experienced telephone technician must often take measurements at several locations, sometimes disconnecting sections of line.

Typically, in standard TDR prior art practice, a "launch pulse" is sent out into a line which is part of a network of cables. Receivers are used to monitor the line for any return signals, which are generally displayed as a TDR trace on a screen with a time-base on the x-axis and signal amplitude on the y-axis. Thus, the arrival time and amplitude of return pulses, which are reflections from discontinuities in the line impedance at various locations in the line, can be measured and analyzed. Given a pulse propagation velocity in the line, the arrival time of a return pulse depends on the location of the corresponding anomaly, while the return pulse amplitude is related to the attenuation both in the line as well as at the anomaly itself.

There is a trade-off between the pulse width and resolution in pulse return time, which corresponds to distance or reach along the line or cable. For short cables, a narrow pulse is suitable as it gives high time resolution. When the cable is long, its effective bandwidth is significantly reduced. A narrow pulse into a long cable experiences so much attenuation that the reflections become practically undetectable. For this reason, longer cables require a wider pulse, which has energy at lower frequencies.

Wider pulses are however limited in their the capability to resolve closely spaced multiple discontinuities such as opens, shorts or bridged-taps (BT). One of the possible reasons is due to complications with backscatter. Backscatter is a phenomena where the received voltage of the return signal gradually rises during the launch pulse and then slowly decays after the launch pulse has finished. For longer lines where the launch pulse is long and the return signal received from a fault is small, the decaying voltage backscatter may mask the return signal received from the fault.

As shown in FIG. 1, a typical TDR 100 comprises a pulse generator 1 which is capable of generating pulses with pulse widths in the nanosecond to millisecond range. For balanced lines as in a telephone system, the pulse generator 1 differentially drives the line under test 8 with a differential output line driver 2 through a pair of impedance matching resistors 3$a,b$. A differential pulse is injected at a start time into the cable or line under test 8. Any faults in the form of impedance discontinuities will cause a reflected wave that will arrive back as a return voltage signal, where it is received by an input of the differential receiver 5 at some arrival time after the start time. The amplifier 6 amplifies the return voltage signal of the reflected wave and transmits it to an analog input 7$a$ of an analog to digital converter (ADC) 7 which produces digitized samples at its output 7$b$. Digital timing is controlled with some form of synchronous digital timing or timebase generator 4, which provides an enable signal 10 to an enable input 7$c$ and a sampling clock signal 11 to a clock input 7$d$ of the ADC 7. The digitized samples together with a corresponding timestamp from the timebase are fed into a microprocessor 9, analyzed and presented to a user for interpretation.

In standard Pulse TDR, the pulse generator 1 generates pulses with a pulse width ranging from the low nanosecond to the low microsecond range. Examples of traces obtained with this TDR technique are shown in FIGS. 2$a$, 2$b$ and 2$c$ for an open, a short and a bridged tap fault, respectively. The return voltage signal [volt] is plotted on the x-axis against distance [feet] along the line under test 8.

Standard Step TDR uses a pulse width which is of relatively longer duration, from about several microseconds up to a millisecond or more. These pulses have a fast rise time in order to provide energy over a broad frequency spectrum, permitting faults to be detected over an extended range of cable lengths. Examples of traces obtained with the Step TDR technique are shown in FIGS. 3$a$, 3$b$ and 3$c$ for an open, a short and a bridged tap fault, respectively. The return voltage signal [volt] is plotted on the x-axis against distance [feet] along the line under test 8.

The return signals of a Pulse TDR are easier to interpret so by and large they are generally preferred in the telecom test equipment industry. With Step TDR the return signals become considerably more difficult to interpret as the complexity for a network of cables increases.

Standard numerical differentiation of a Step TDR pulse is a well known technique. The pulse generator 1 generates a pulse with a pulse width or duration that is longer than the time required for a pulse to propagate to the end of the line under test 8. The ADC 7 samples the voltage of the return signal at regular intervals with a constant sampling frequency to produce raw data in the form of a series of digital voltage samples. The microprocessor 9 stores each digital voltage sample of the raw data as an element in a data array for further analysis and post processing.

The standard differentiation of the stored raw data is performed numerically in the microprocessor 9. Acquisition times of consecutive digital voltage samples differ by a sampling period. Thus a fixed preset time offset between any two digital voltage samples corresponds to an difference in an array index between the stored elements in a data array. The differentiation proceeds by a pair-wise numerical subtraction of the elements of the array whose indices are offset by an integer multiple of the sampling period equal to the preset time offset. Alternatively the time offset may be deduced from the difference in recorded timestamps between the respective digital voltage sample pairs in the data array.

Exemplary traces obtained with the numerically differentiated Step TDR technique are shown in FIGS. 4a, 4b and 4c for an open, a short and a bridged tap fault, respectively. The return voltage signal [volt] is plotted on the x-axis against distance [feet] along the line under test 8. The resulting traces resemble those of the classical Pulse TDR where the time offset corresponds to the pulse width used in FIGS. 2a, 2b and 2c.

There are some practical limitations of the above technique that stem from the attenuation, pulse spreading and slower rise times of the return signals when the fault to be detected is located at long distances in the line under test 8.

An integrated TDR for locating transmission line faults is disclosed by Williams in U.S. Pat. No. 6,714,021 issued Mar. 20, 2004. The integrated TDR comprises an integrated circuit with a transmitter, a path coupled to the transmitter, and a TDR receiver integrated with the transmitter for analyzing a reflected signal from the path. The TDR receiver compares the reflected signal with a variable reference signal to generate a logic state at a sampling instant determined by a timebase generated by a sampling circuit. The reflected signal equals the variable reference signal when the logic state transitions. The reference signal and the corresponding timebase value are recorded at the logic state transition. A waveform is generated from the recorded reference signal and its corresponding timebase value. A reference point for the waveform is determined. The location of a fault on the transmission line can be determined from the timebase value difference between the reference point and the fault.

However, the number of timebase and gain ranges required to display the acquired traces increases with the length of the cable to be inspected. This can be not only labor intensive and time consuming, but also carry an increased risk of overlooking or missing the detection of some faults.

It is an object of the invention to provide an enhanced TDR method for improving the reliability of detection of faults particularly in long lines or cables.

Another object of the invention is to improve the user interface of acquired data to reduce the number of gain and distance ranges that a user needs to select on a TDR display or other output device in order to inspect a line.

Of particular importance for hand-held instruments, a further object is to provide a specified distance resolution within the constraints of electrical power consumption and consequently limited speed of operation for the TDR electronics, such as a microprocessor clock rate or an analog to digital converter sampling rate.

SUMMARY OF THE INVENTION

A method is provided for using a time domain reflectometer (TDR) to locate a fault in digital subscriber lines such as applied to IDSL, ADSL, HDSL, SDSL, SHDSL, and VDSL communication systems (collectively xDSL) having a characteristic impedance.

The method comprises providing a TDR transmitter and receiver, transmitting at least one launch pulse into the xDSL with the TDR transmitter and initiating a start time in a timebase, and receiving a return signal trace from the xDSL with a TDR receiver.

The return signal trace is then digitized to generate an array of digital samples and sampling time information from the timebase prior to recording the array of digital samples and sampling time information.

Finally the array of digital samples is numerically differentiated by generating an arithmetic difference between at least two digital samples sampled at sampling times separated by an adjustable time offset, which is increased as a function of elapsed time from the start time.

BRIEF DESCRIPTION OF THE DRAWINGS

The invention will be described in greater detail with reference to the accompanying drawings which represent preferred embodiments thereof, wherein.

DETAILED DESCRIPTION

Figure 5:
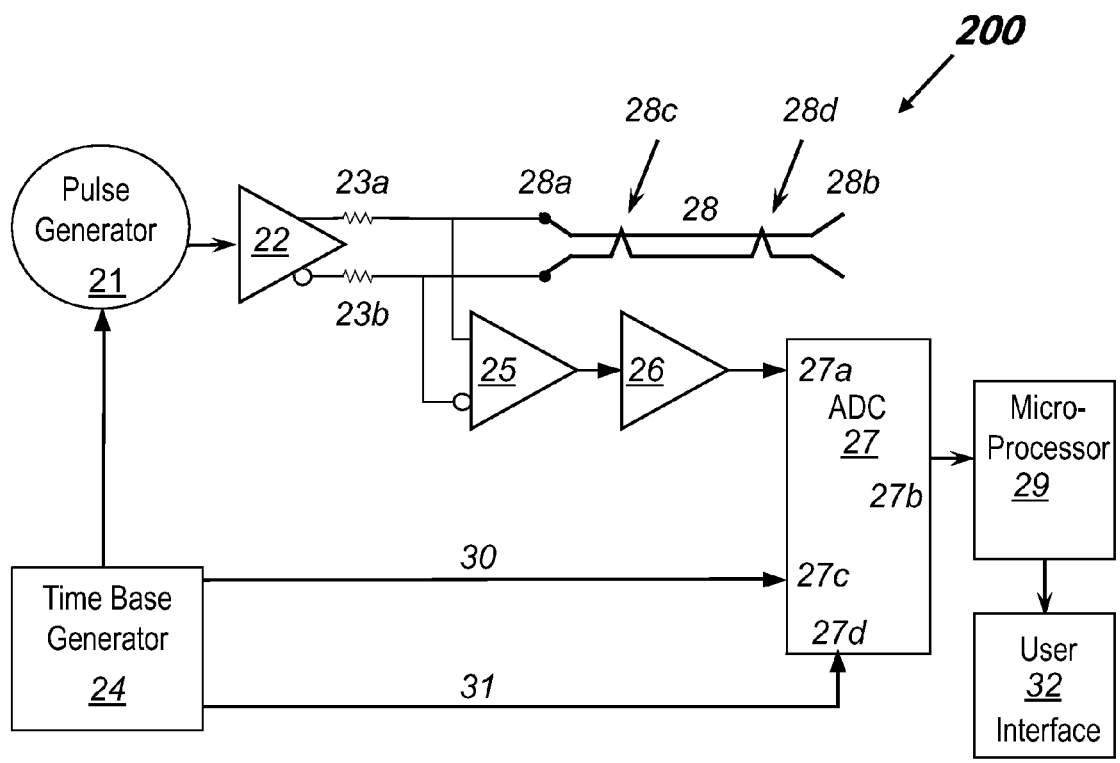
FIG. 5 is a schematic illustration of a TDR system in accordance with the present invention.

To address the problems associated with prior art time-domain reflectometer (TDR) techniques, the present invention is based on a modified Step TDR 200 shown in FIG. 5. A pulse generator 21 is used to generate one or more launch pulses with a pulse width ranging from about 10 nanoseconds up to a millisecond or more.

For balanced lines as in a telephone system, the pulse generator 21 differentially drives the cable under test 28 with a differential output line driver 22 through a pair of impedance matching resistors 23a, 23b. A differential launch pulse is injected at a start time into the near-end 28a of the cable or line under test 28, where it propagates towards the far-end 28b. Any faults in the form of impedance discontinuities 28c, 28d will cause a reflected wave that will arrive back at the near-end 28a as a return voltage signal, where it is received by an input of a differential receiver 25 at an arrival time subsequent to the start time depending on the location of the impedance discontinuity causing it.

The adjustable gain amplifier 26 amplifies the return voltage signal of the reflected wave received from the differential receiver 25 and transmits it to an analog input 27a of an analog to digital converter (ADC) 27. The gain of the adjustable gain amplifier 26 may also be made to vary with time, as in the time-varying gain (TVG) technique disclosed by Wyar in U.S. Pat. No. 7,116,111 issued Oct. 3, 2006, which is incorporated herein by reference.

The ADC 27 samples and digitizes the voltage of the return signal at regular intervals with a constant sampling frequency to produce raw data in the form of a series of digital voltage samples, each acquired at an acquisition time separated from the previous one by one sampling period.

Digital timing is controlled with a suitable form of synchronous digital timing or timebase generator 24, which provides an enable signal 30 to an enable input 27c and a sampling clock signal 31 to a clock input 27d of the ADC 27. The timebase generator 24 may also be used to provide a timestamp of the acquisition time for each of the digital voltage samples. The acquisition time is timed from the start time when the launch pulse is injected into the line under test 28 by the pulse generator 21.

The digitized voltage samples may be stored together with their corresponding acquisition time as elements of a data array in a microprocessor 29 comprising a memory, e.g. a random access memory or similar for further analysis and post-processing. Alternatively, it may be sufficient to record the sampling period in the microprocessor 29 to permit the acquisition time of the digitized voltage samples to be calculated from their position within the array. The microprocessor 29 presents the results of the analysis and post processing to a user for interpretation on a suitable user interface 32 such as a LCD screen, an oscilloscope or printer. In some designs it may be advantageous for the microprocessor 29 to incorporate the timing and control functions of the timebase generator 24. Several or all of the electronic components such as the pulse generator 21, the differential output line driver 22, differential receiver 25, the adjustable gain amplifier 26, the timebase generator 24, the microprocessor 29, the ADC 27, etc. may be combined or packaged in convenient modules or a housing.

The pulse width of the launch pulse is an important parameter that can be used for distinguishing between a short, a wet section and a BT. The return pulse shape and amplitude is related to the cable type and the distance to an anomaly or fault in the cable under test 28. Therefore when using a Pulse TDR it would normally be necessary to inspect over several ranges of distance along the length of the line or cable under test 28 and select many different values of pulse width in order to avoid overlooking significant discontinuities. The TDR analysis becomes even more complex when locating these faults in a cable plant with mixed cable types. Thus, to effectively inspect a typical network of cables where xDSL services are to be run, performing the required amount of measurements using such standard techniques would become time-consuming and labor intensive.

On the other hand, in Step TDR, the width or duration of the launched pulses from the pulse generator 21 are customarily longer than the time required for a pulse to propagate from a near-end 28a to a far-end 28b of the line under test 28. The launch pulses have a fast rise time in order to provide energy over a broad frequency spectrum, so that faults can be detected over an extended range of cable lengths.

In accordance with the present invention, it has been determined that launch pulses of such pulse length may not always be practical, particularly where the line under test 28 is long. Thus in the modified Step TDR 200 the preferred pulse length advantageously lies between that used in a prior art Pulse TDR and its Step TDR counterpart.

Table 1 shows preferred pulse widths suitable for line lengths of typical 24 gauge cable. Note there are a few different types of cable with loss characteristics that can change the effective maximum distance by about +/−45%.

TABLE 1

| Pulse Width | Pulse width in length (Minimum distance, feet) | Typical Max distance feet | Typical resolution in the final 33% of line [feet] | Ratio: Resol/Max Dist |
|---|---|---|---|---|
| 16 nS | 5.3 | 4,800 | 500 | 10.4% |
| 64 nS | 21.3 | 6,600 | 800 | 12.1% |
| 250 nS | 83.3 | 9600 | 1,000 | 10.4% |
| 1 μS | 333 | 13,000 | 2,000 | 15.4% |
| 4 μS | 1,332 | 18,000 | 5,400 | 30.0% |

It is to be noted that for pulses with a large pulse width the degradation of the effective resolution becomes quite significant, which can render the detection of multiple faults rather difficult.

To alleviate the inspection of typical cable networks for xDSL the present invention provides for the acquisition of a limited number of traces with the modified Step TDR 200, followed by an adaptive numerical differentiation of the captured return voltage traces using the microprocessor 29, with appropriate programming.

As outlined above, the Step TDR in conjunction with a fixed time offset used in differentiating the return signal produces a trace that is similar to that of the Pulse TDR technique in which the launch pulse width has the same duration as the time offset. The time offset used in the differentiation is thus equivalent to an effective pulse width.

In contrast to prior art techniques which use a fixed time offset in the differentiation, the present invention provides for an adaptive numerical differentiation, in which the time offset is varied in a systematic way.

The adaptive numerical differentiation is performed in the microprocessor 29, by setting the time offset or, equivalently, the effective pulse width, to an initial time offset. Elements are selected in pairs from the data array such that the difference in their acquisition times equals the time offset. The differentiation proceeds by taking the pairs of elements sequentially in the order in which they were acquired. A first element of the pair which has the later acquisition time is then numerically subtracted from the other element of the pair and the differences thus obtained are stored in an ordered differentiated data array. It is advantageous to choose values for the time offset which are an integer multiple of the sampling period.

As the differentiation progresses through the data array, the time offset is gradually increased until a final time offset is reached, preferably when the acquisition time of the later element of the pair being subtracted corresponds to the distance to the far end 28b of the line under test 28. Thus, the effective pulse width is adapted in the microprocessor 29 to the distance of a fault by increasing the time offset with elapsed time following the start time when the launch pulse has been injected into the line under test 28 by the pulse generator 21. This adaptive pulse width (APW) technique can thus achieve a high resolution for fault locations at all points along the cable without sacrificing reach for long cables.

The nature of TDR over transmission cables is such that the longer the distance in the line or cable, the slower the rise and fall times of the return voltage signal become. By progressively increasing the time offset used in the numerical differentiation process performed by the microprocessor 29 as described above, the differentiated returning pulse may reach a higher peak value. This in effect resembles the classical Pulse TDR, but the effective pulse width can now be optimized as a function of distance along the line under test 28.

For example, a prior art Pulse TDR may have eight pulse width ranges: 10 ns, 20 ns, 50 ns, 100 ns, 200 nS 500 ns, 1 µS and 4 µS. However, if a typical ADSL cable has a length of 13,000 feet, only the 1 µS and 4 µS pulse widths will reach that far. Line faults or anomalies like BTs within 2,000 feet of the end of the cable will not be detectable.

According to the present invention, for the same example, the resolution is improved to about 5% of the maximum distance or 850 feet.

For a linear increase, the time offset, dt, used in the differentiation can be expressed by the relationship:

$$dt = dt_{init} + T*K,$$

where T is the elapsed time in nanoseconds after the launch pulse, $dt_{init}$ is the initial time offset and K is a constant suitably chosen to produce a desired peak value at a final time offset. In this example, K=0.04 to produce the final time offset or maximum value of 1.56 µs.

Figure 1:
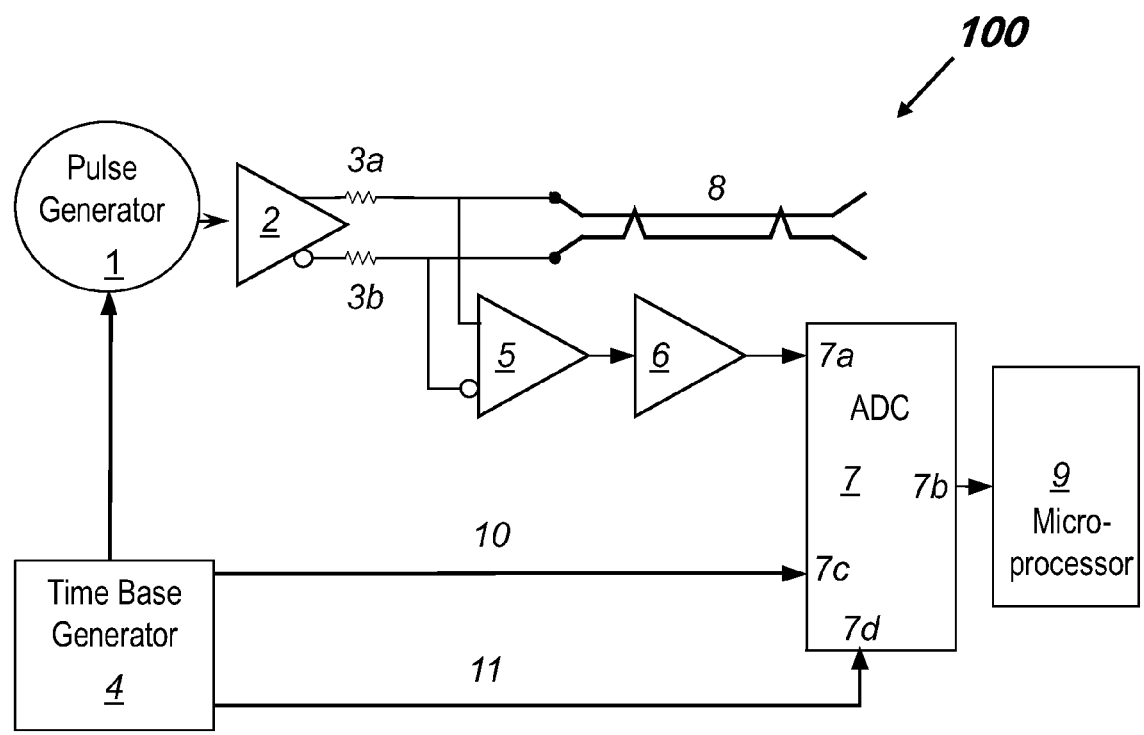
FIG. 1 is a schematic of a typical prior art TDR system.
Figure 2A:
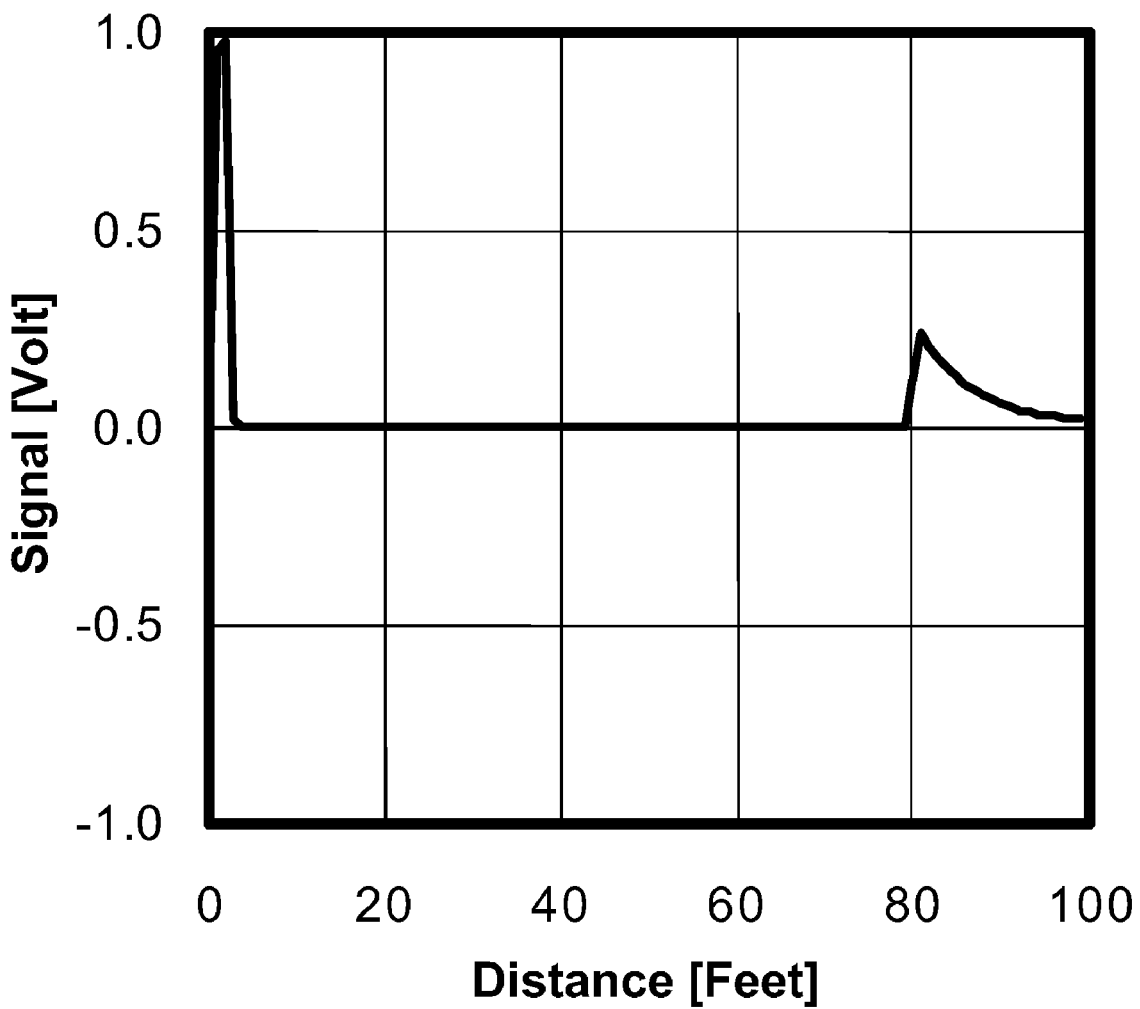
FIGS. 2a, 2b and 2c are prior art display traces of a Pulse TDR signal response corresponding to an open, a short and a bridge tap fault, respectively, in a transmission line.
Figure 2B:
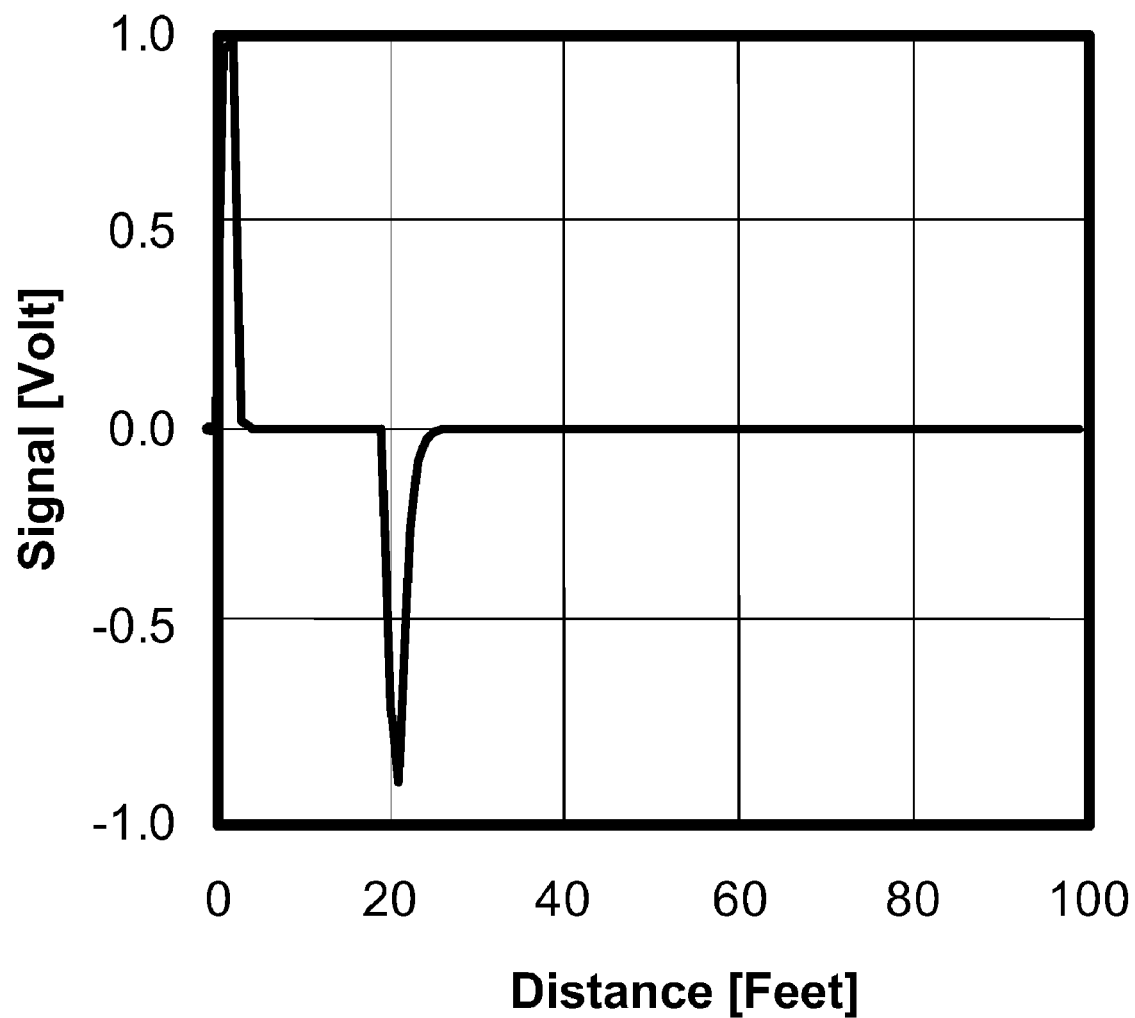
Figure 2C:
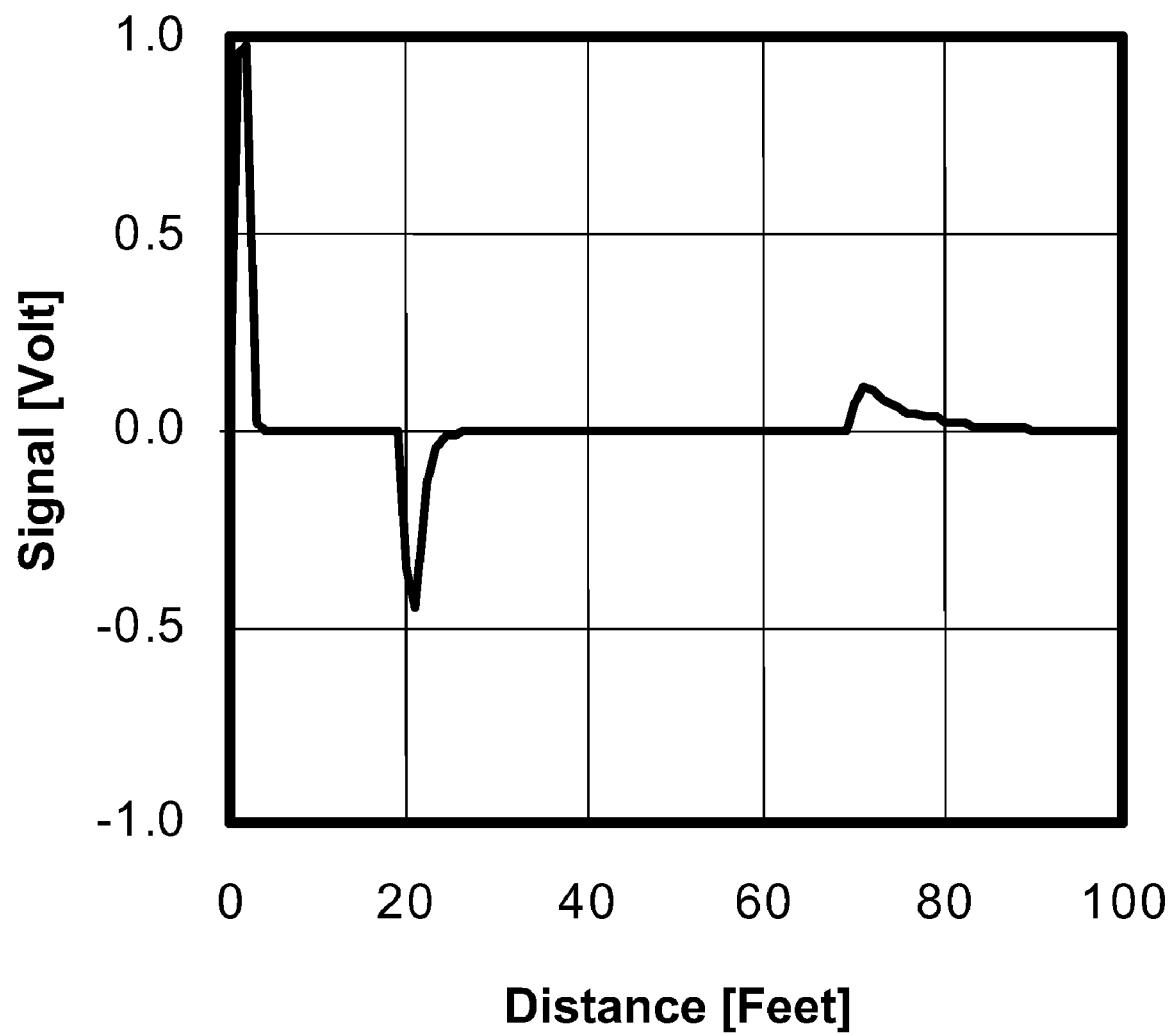
Figure 3A:
FIGS. 3a, 3b and 3c are prior art display traces of a Step TDR signal response corresponding to an open, a short and a bridge tap fault, respectively, in a transmission line.
Figure 3B:
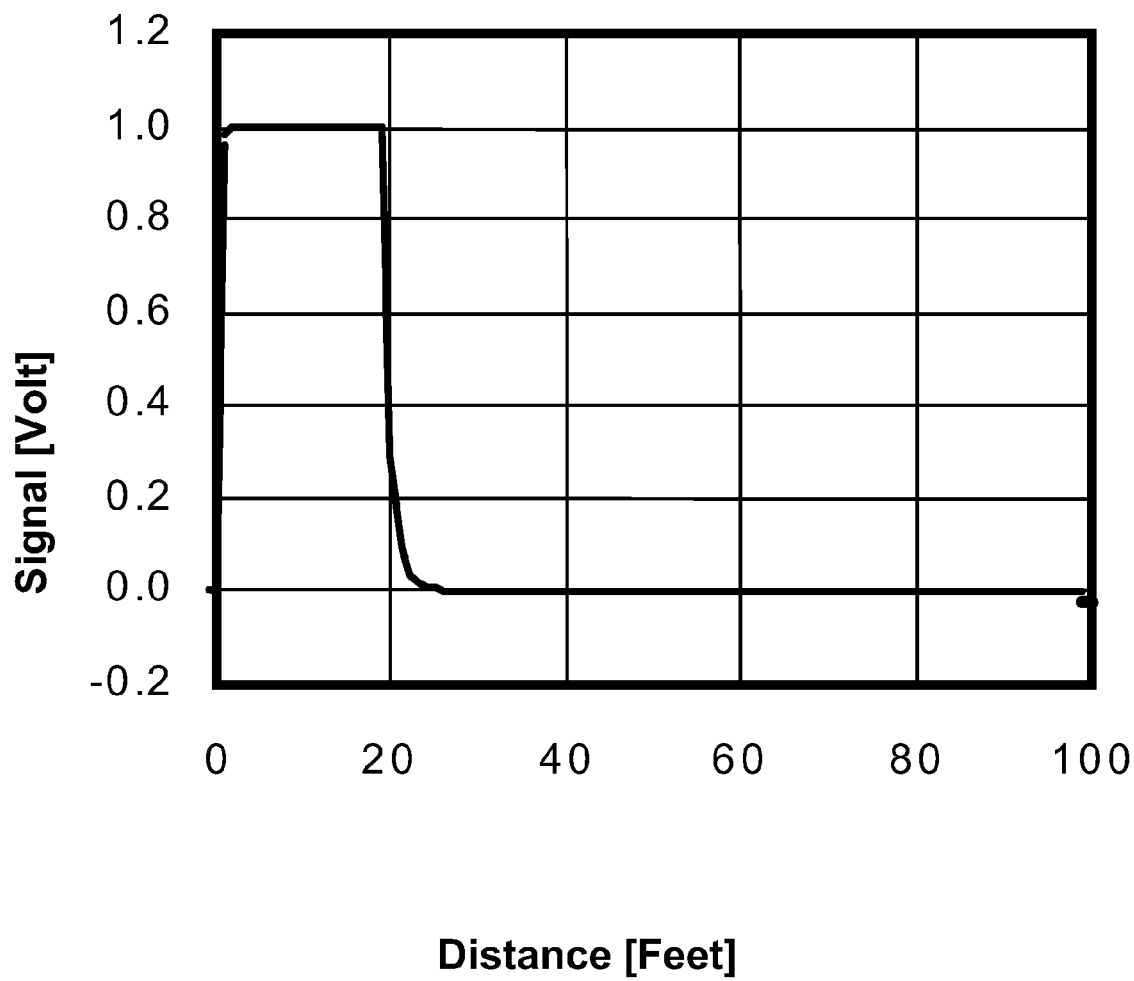
Figure 3C:
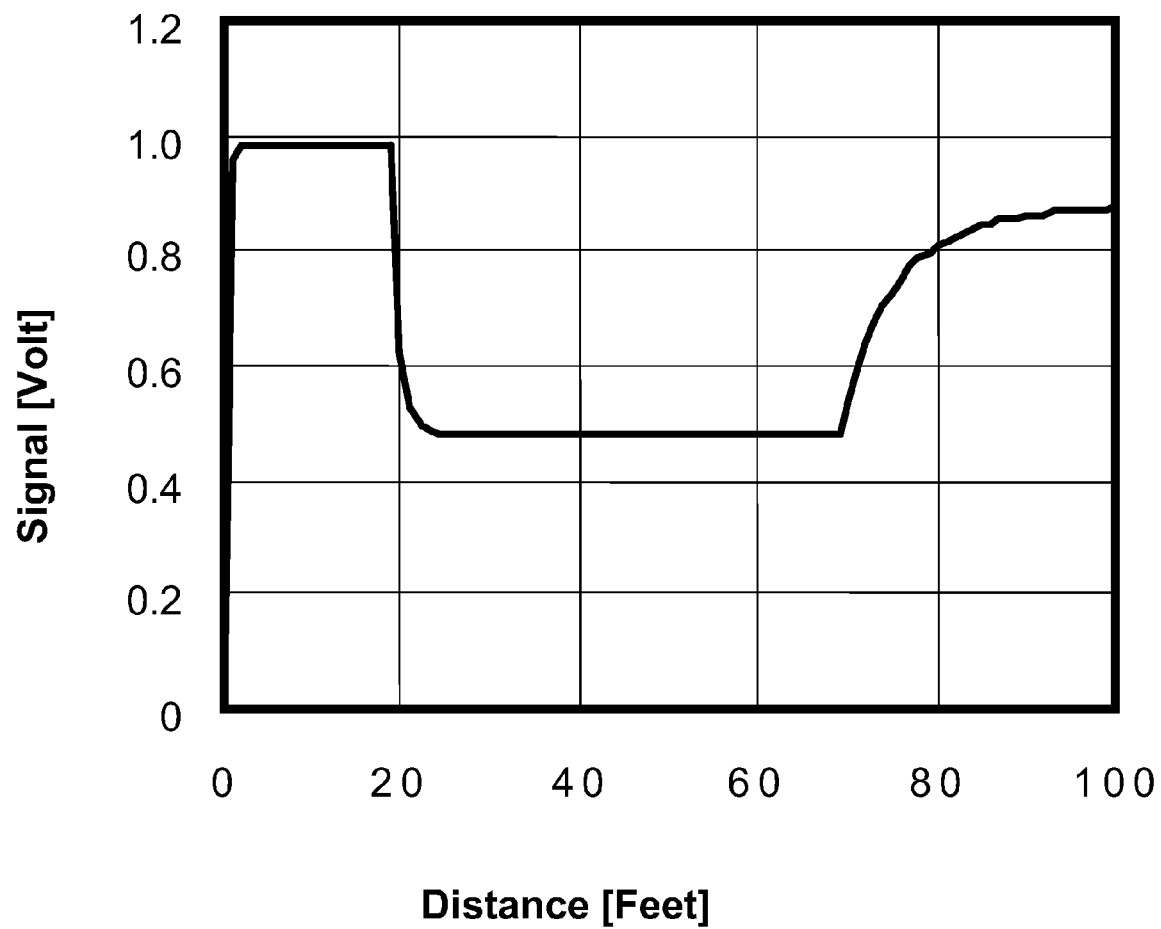
Figure 4A:
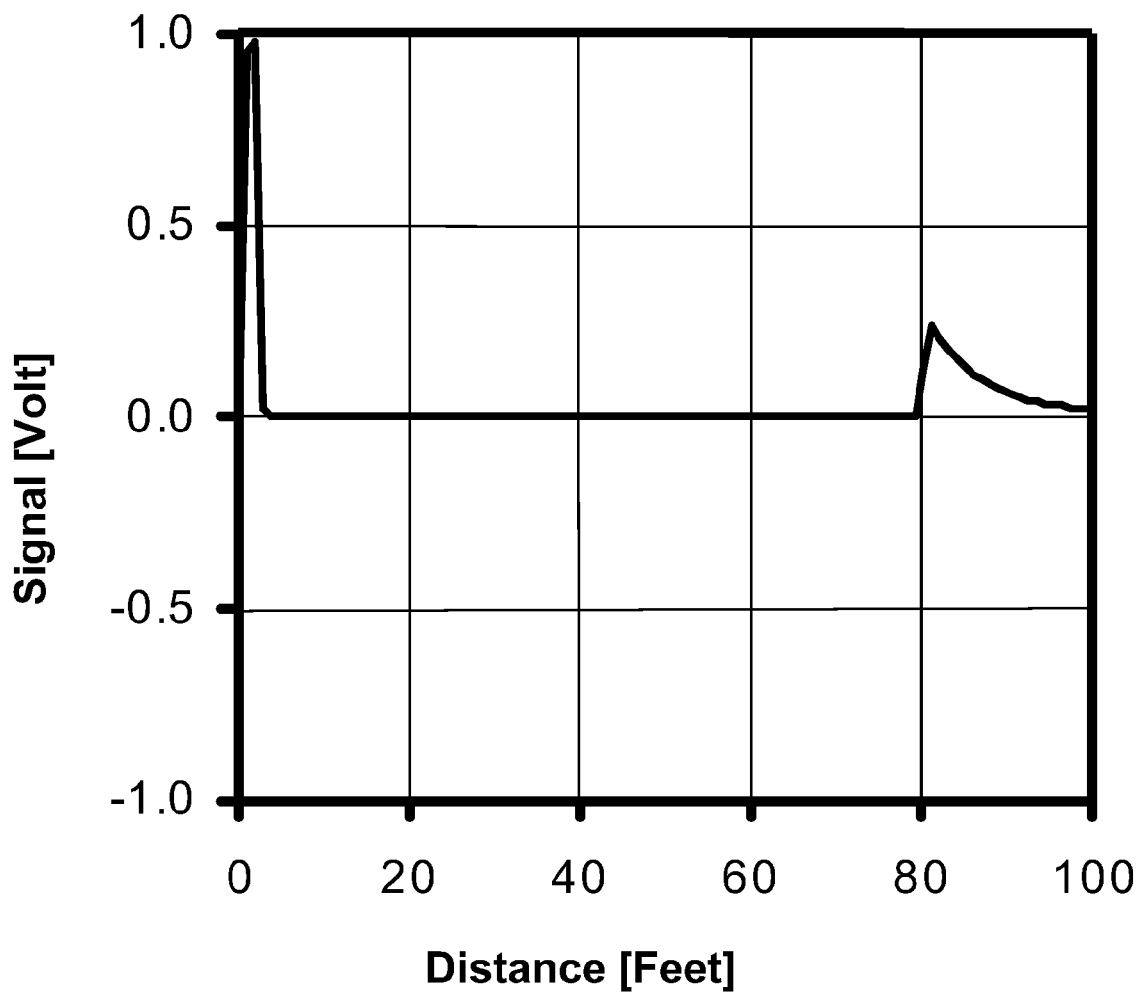
FIGS. 4a, 4b and 4c are prior art display numerically differentiated traces of the Step TDR signal response in FIGS. 3a, 3b and 3c, respectively.
Figure 4B:
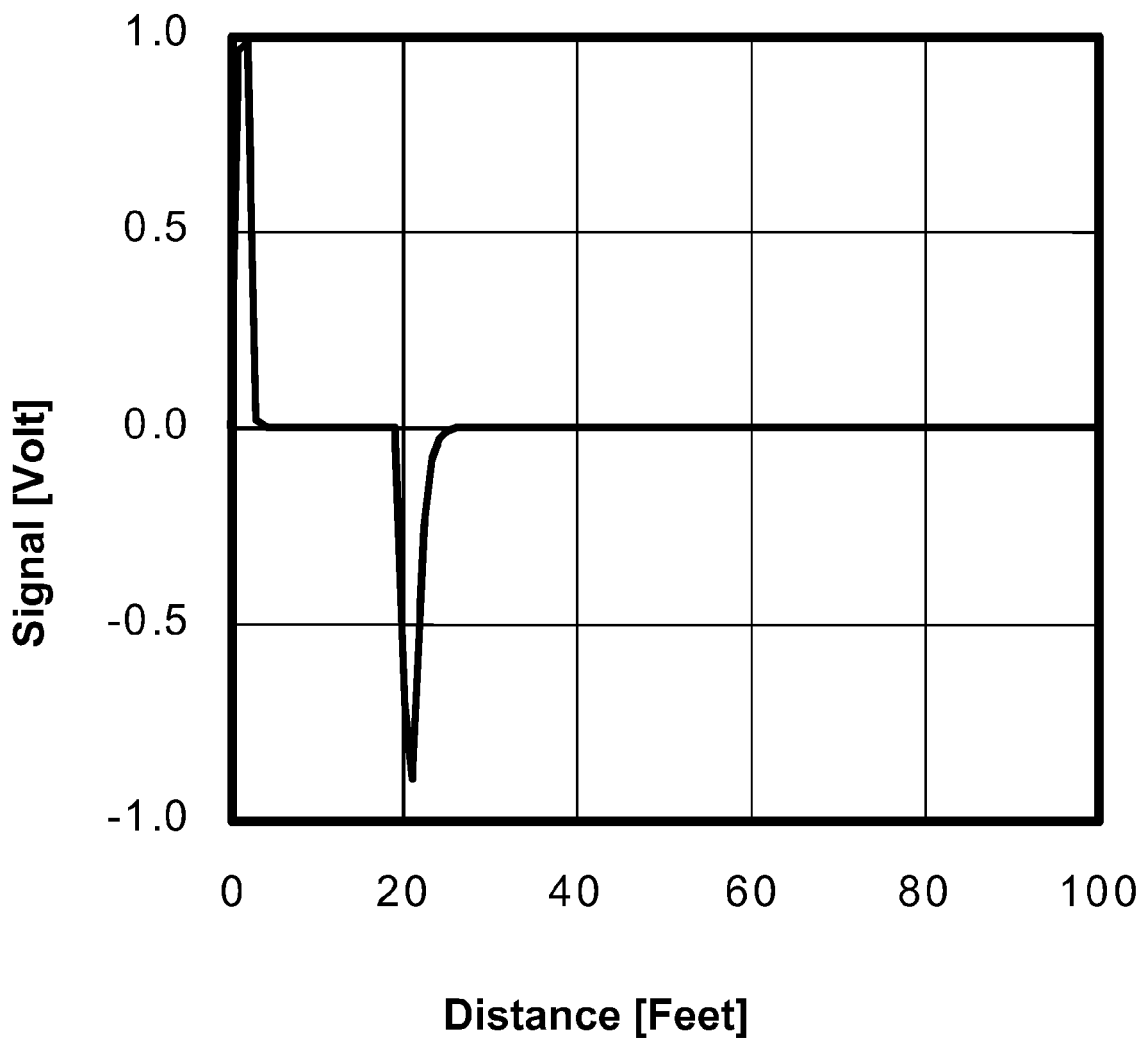
Figure 4C:
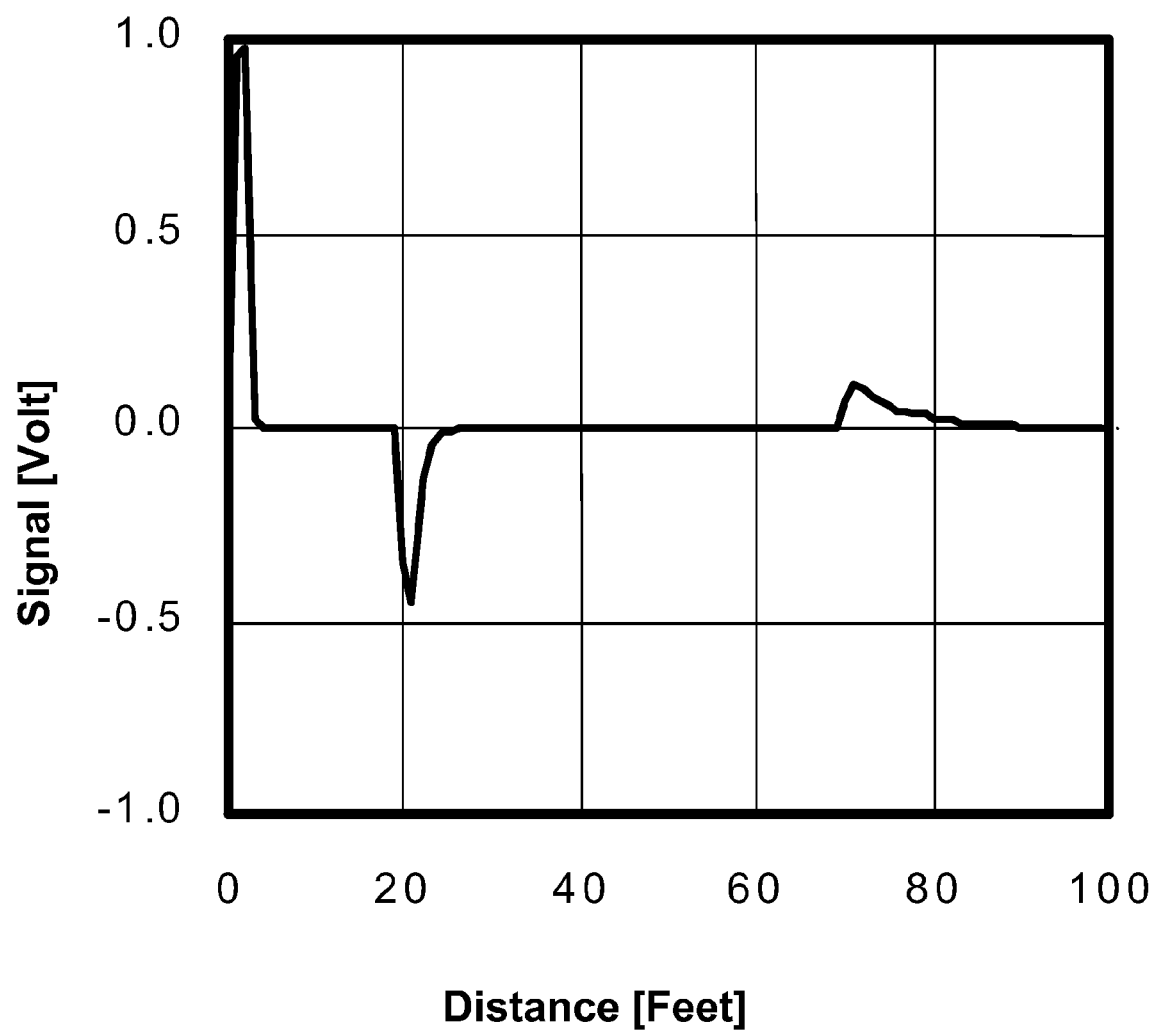
Figure 6A:
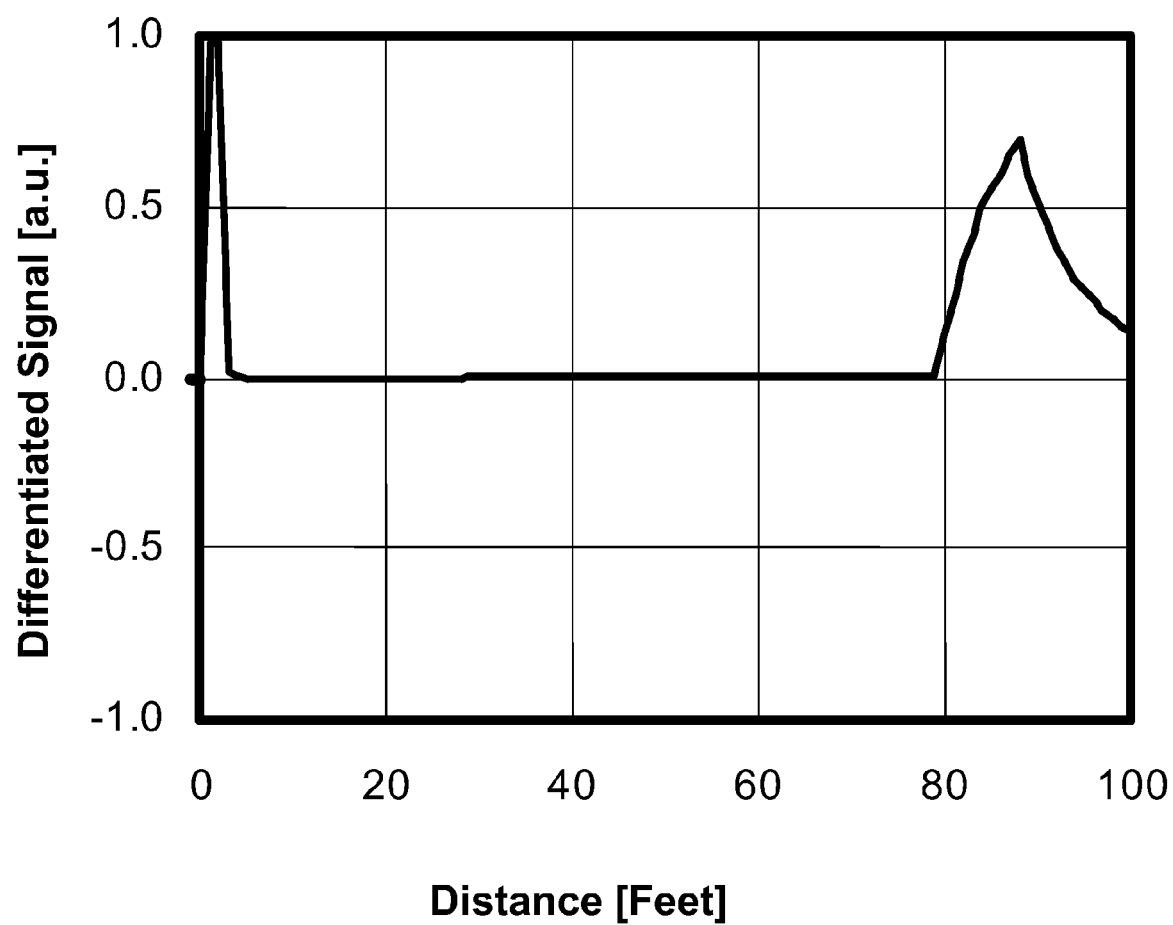
FIGS. 6a, 6b and 6c are traces of a TDR signal response numerically differentiated according to the present invention corresponding to an open, a short and a bridge tap fault, respectively, in a DSL line.
Figure 6B:
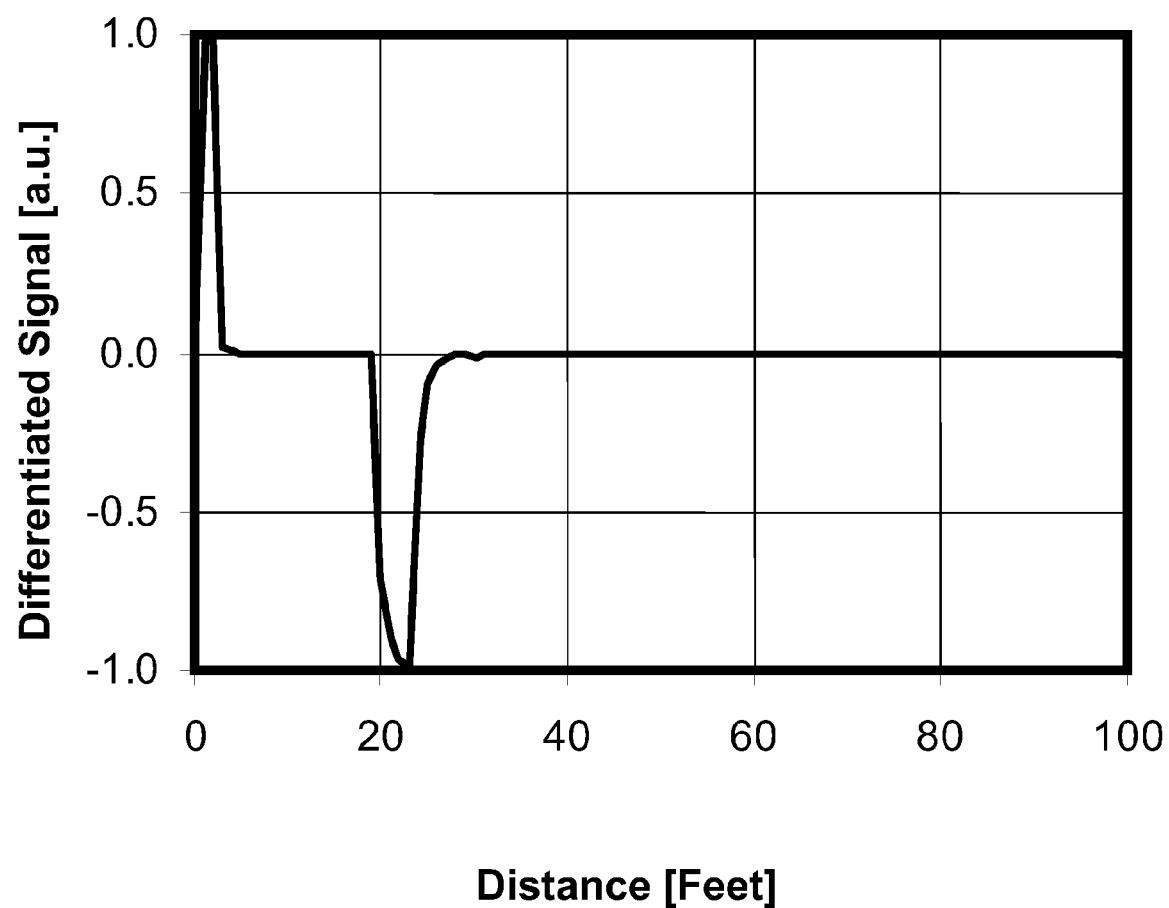
Figure 6C:
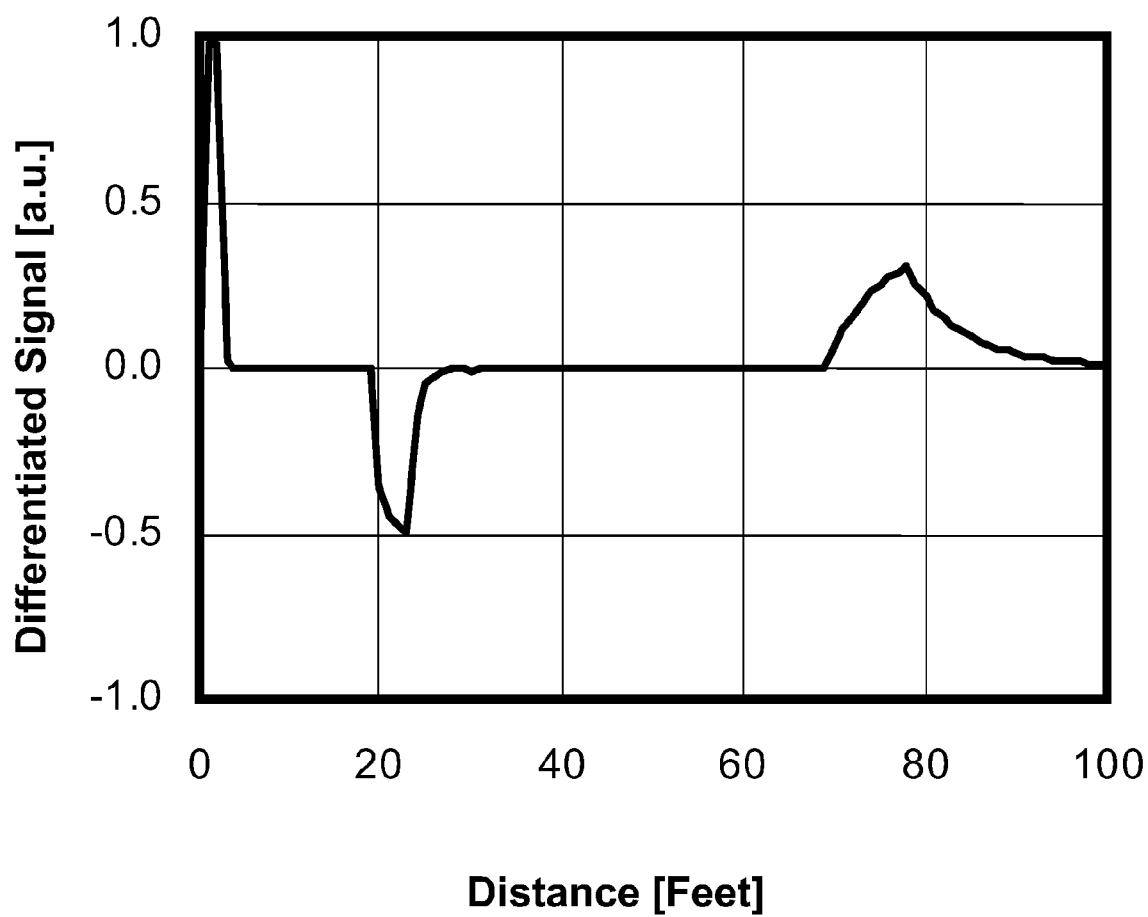

Exemplary traces obtained with the APW technique are shown in FIGS. 6a, 6b and 6c for an open, a short and a bridged tap fault, respectively. The return voltage signal [volt] is plotted on the x-axis against distance [feet] along the cable under test 28 from the near-end 28a. Comparing these traces with those of the corresponding prior art in FIGS. 4a, 4b and 4c, respectively, the improved peak values of the return pulses are evident.

When dealing with cables of widely varying lengths, it can become problematic to scrutinize the whole cable without missing a section. Typical ranges are from 660 nS to 100 µS, or equivalently, 200 ft to 30,000 ft. Currently a prior art TDR requires from 3 to 20 time/distance ranges to inspect the whole length of a DSL line.

Figure 7A:
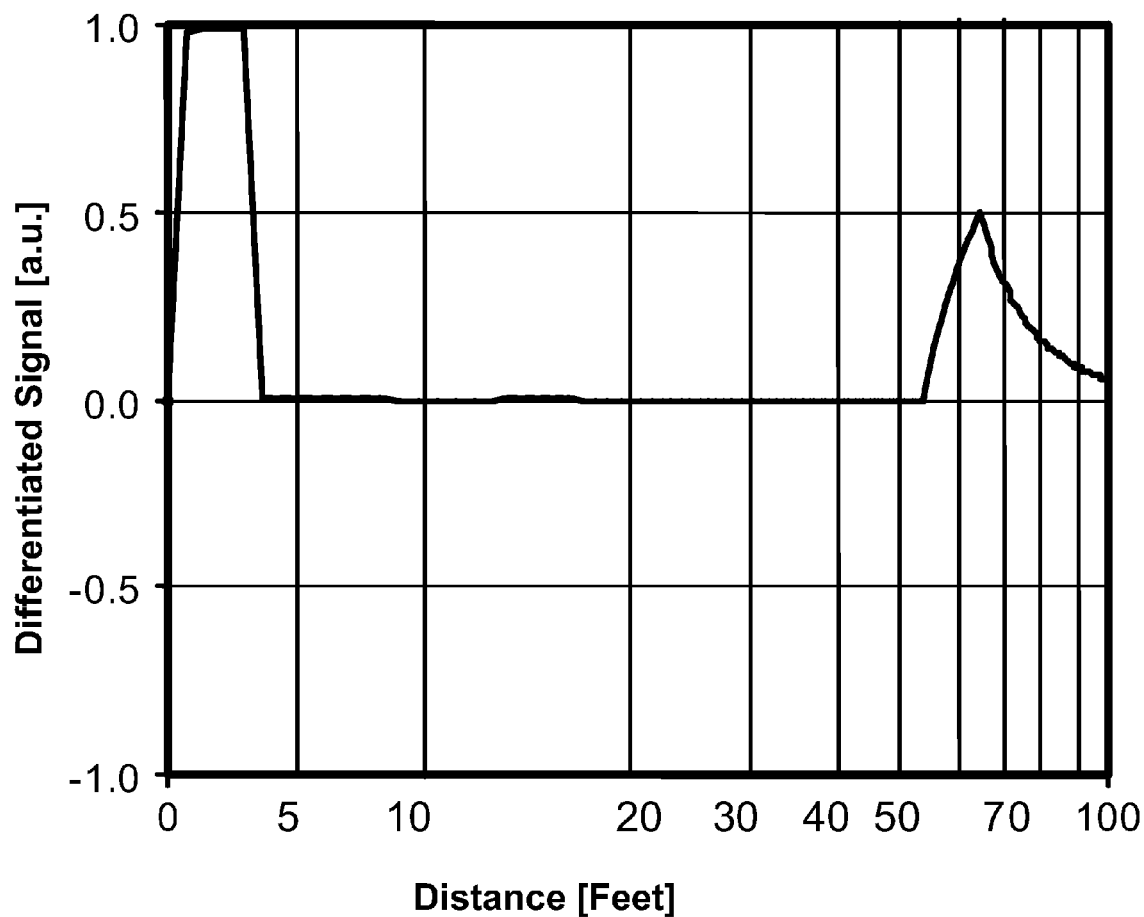
FIGS. 7a, 7b and 7c are traces of a TDR signal response on a hybrid linear-log distance scale, numerically differentiated according to the present invention corresponding to an open, a short and a bridge tap fault, respectively, in a DSL line.
Figure 7B:
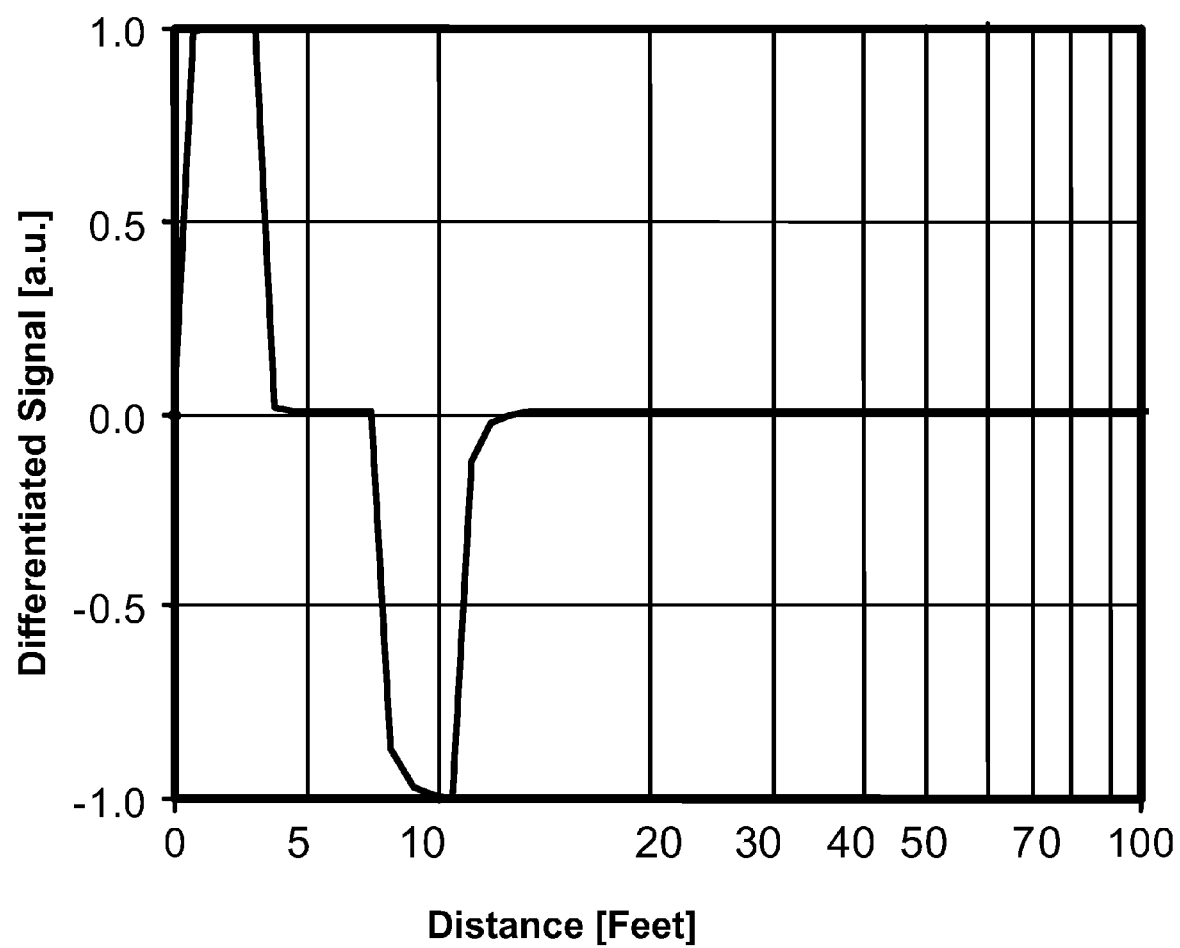
Figure 7C:
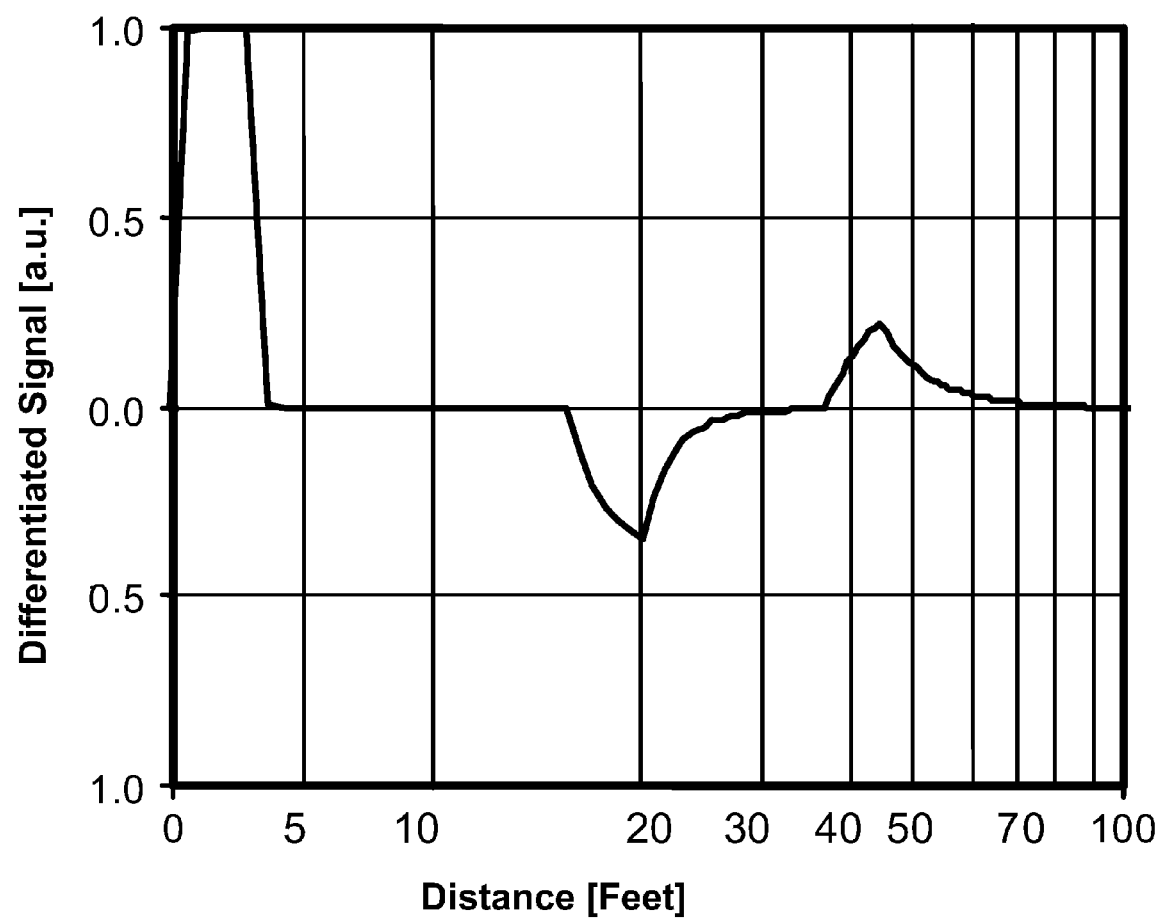

A useful technique to improve the reliability of inspections in this case can be provided by displaying the traces illustrated in FIGS. 5a, 5b and 5c on the user interface 32 using a hybrid linear-logarithmic distance scale, as plotted in corresponding FIGS. 7a, 7b and 7c. The scale in this example is linear from 0 to 10 feet, then logarithmic from 10 to 100 feet.

This technique allows a user to view a much greater amount of information on a single graph. As described previously the longer the line or cable length, the slower the rise and fall times of returning voltage signals become. When coupled with the time varying offset of the APW technique, the pulses appear much wider as a function of time (or equivalently, distance) in the cable under test. By compressing the time (or distance) scale onto the hybrid linear-logarithmic axis, it is possible to make all of the return pulses to appear similar in width, thereby providing more useful information on one graph.

The time varying gain (TVG) technique disclosed by Wyar in U.S. Pat. No. 7,116,111 can be combined with the present invention to further increase the amount of information available on one graph. Currently from 8 to 15 gain ranges are needed to inspect a cable over its entire length. By additionally using TVG, all gain ranges can be plotted as a single graph on the user interface 32.

Figure 8A:
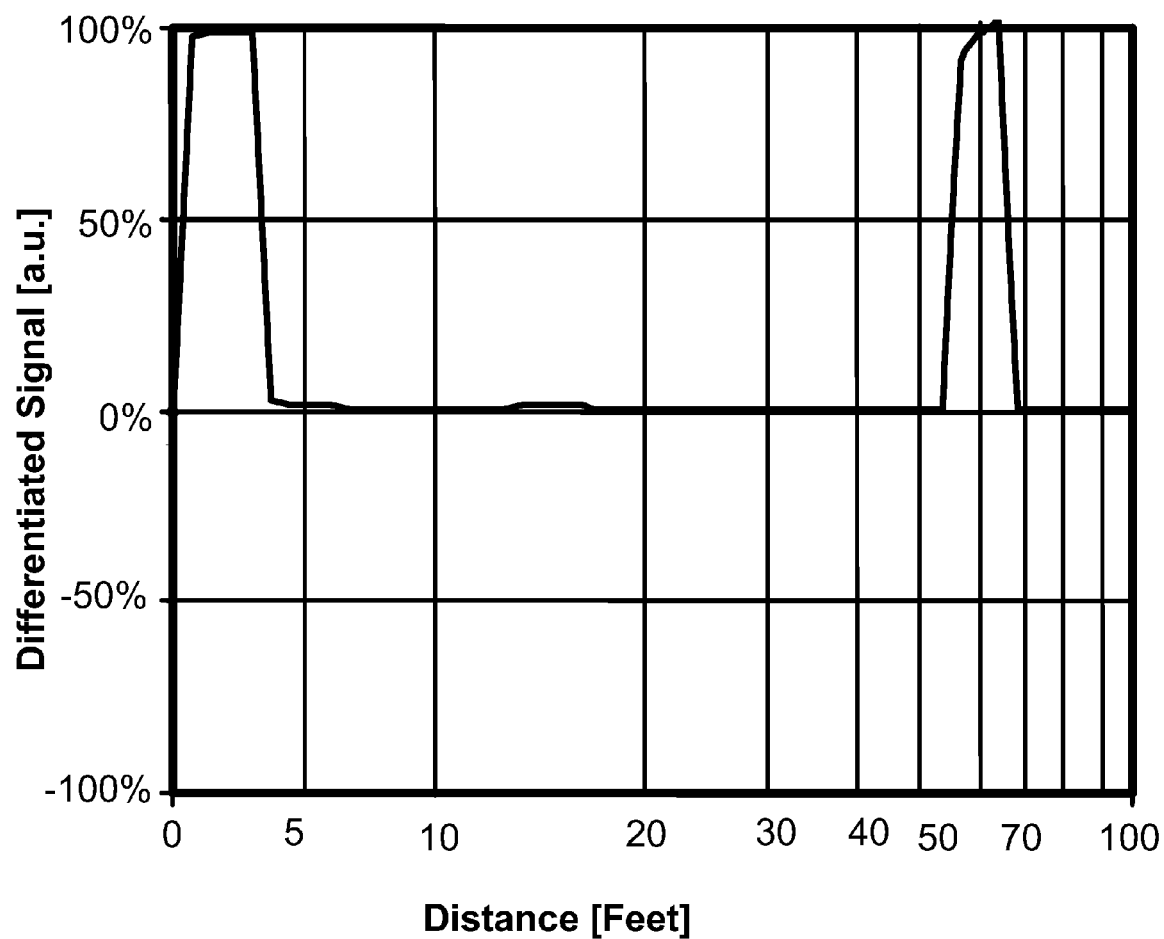
FIGS. 8a, 8b and 8c are traces of a TDR signal response on a hybrid linear-log distance scale, numerically differentiated with time varying gain according to the present invention corresponding to an open, a short and a bridge tap fault, respectively, in a DSL line.
Figure 8B:
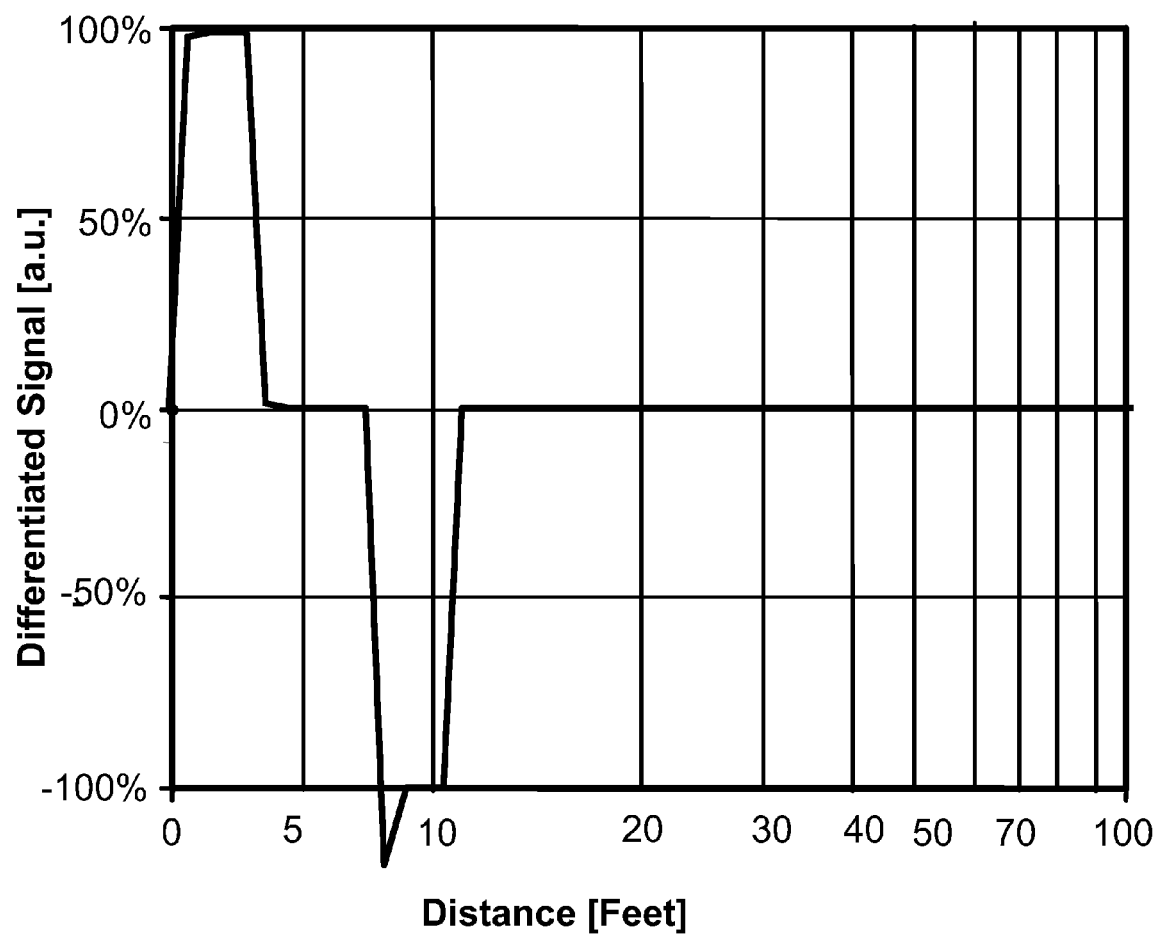
Figure 8C:
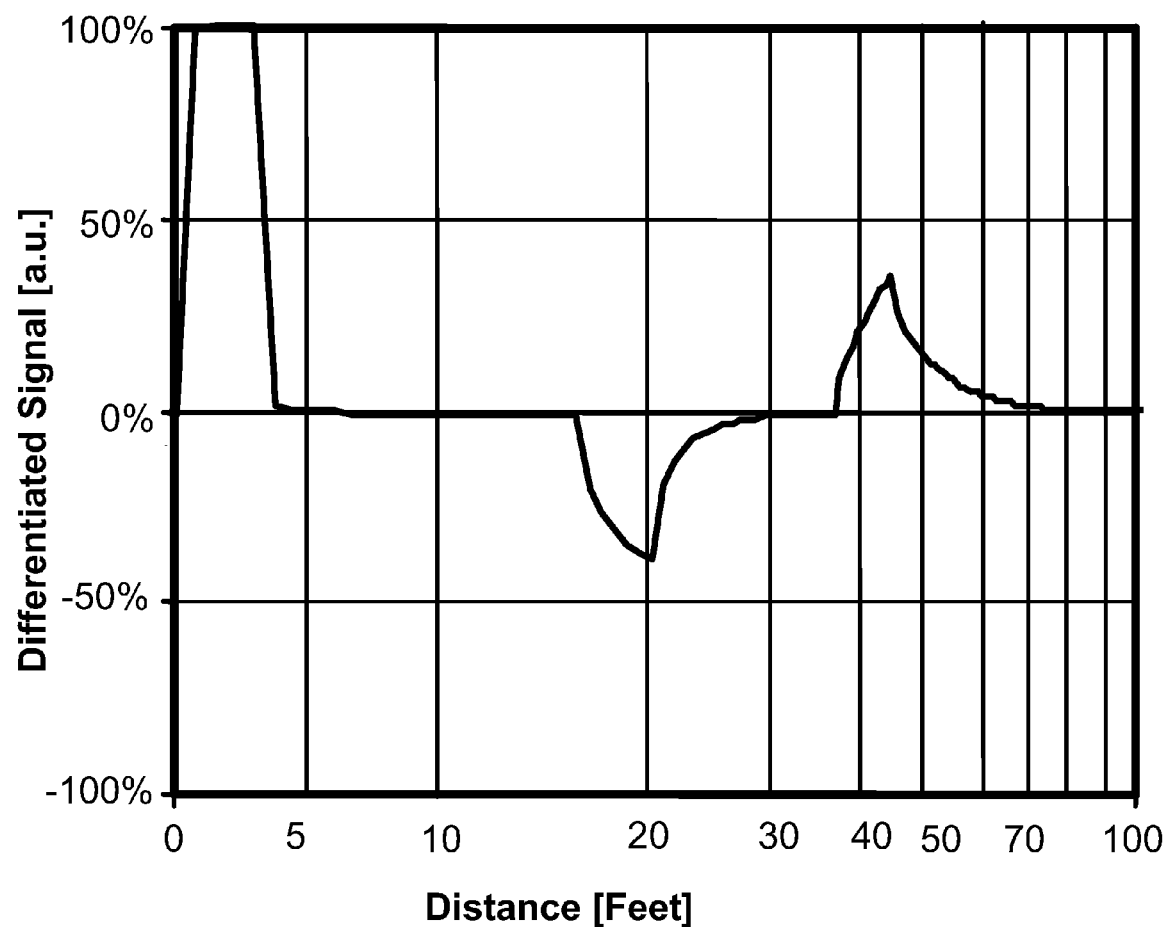

Exemplary traces obtained with the APW technique in combination with TVG are shown in FIGS. 8a, 8b and 8c for an open, a short and a bridged tap fault, respectively. The return voltage signal [volt] is plotted on the x-axis with a hybrid linear-logarithmic distance scale. Comparing these traces with those without TVG in FIGS. 7a, 7b and 7c, respectively, the peak value normalization of the return pulses can be clearly observed.

Figure 9A:
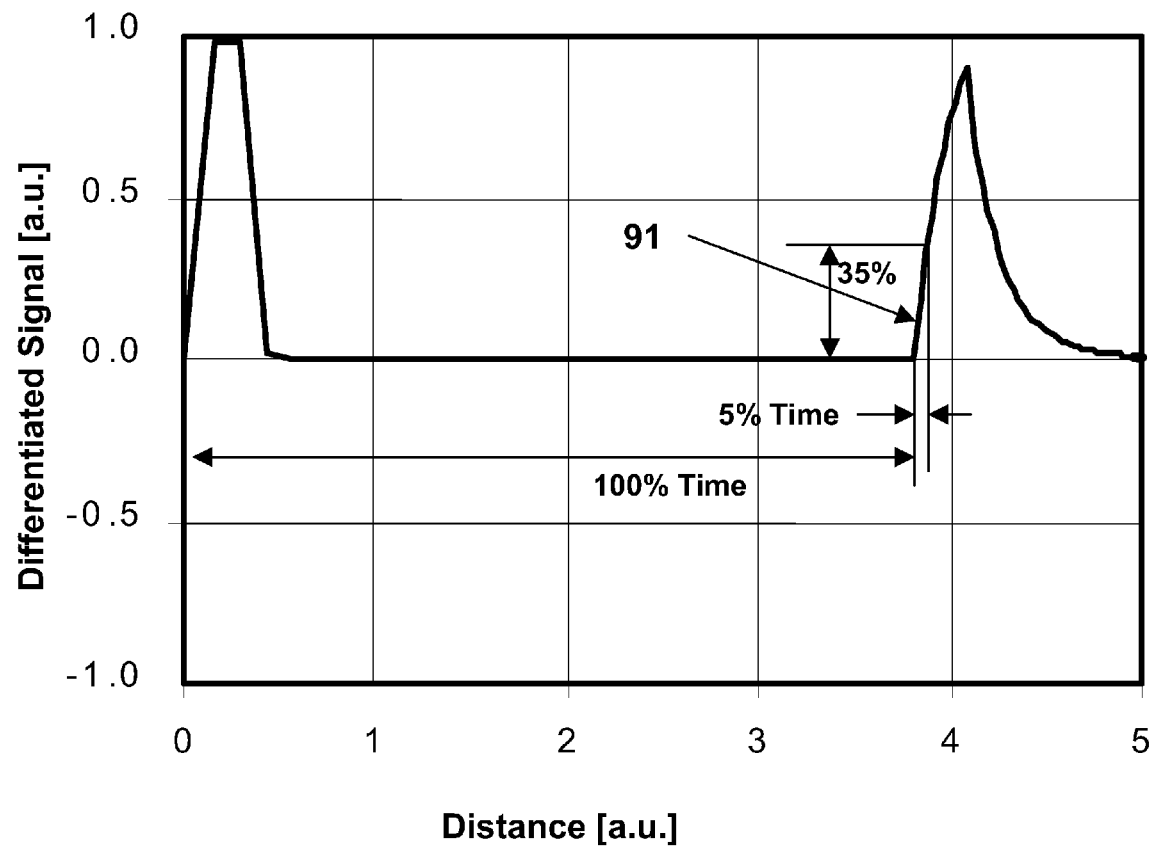
FIGS. 9a, 9b and 9c are schematic representations similar to the traces in FIGS. 8a, 8b and 8c, respectively, illustrating methods of interpreting the TDR signal response.
Figure 9B:
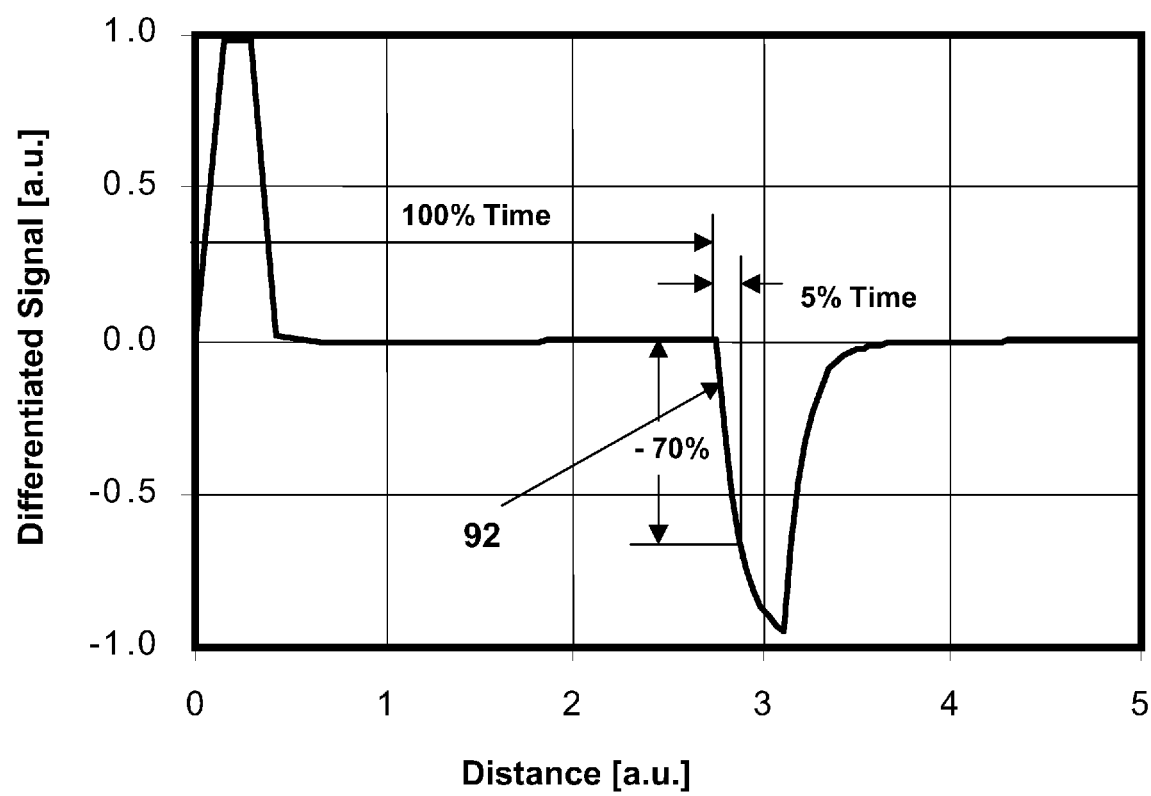
Figure 9C:
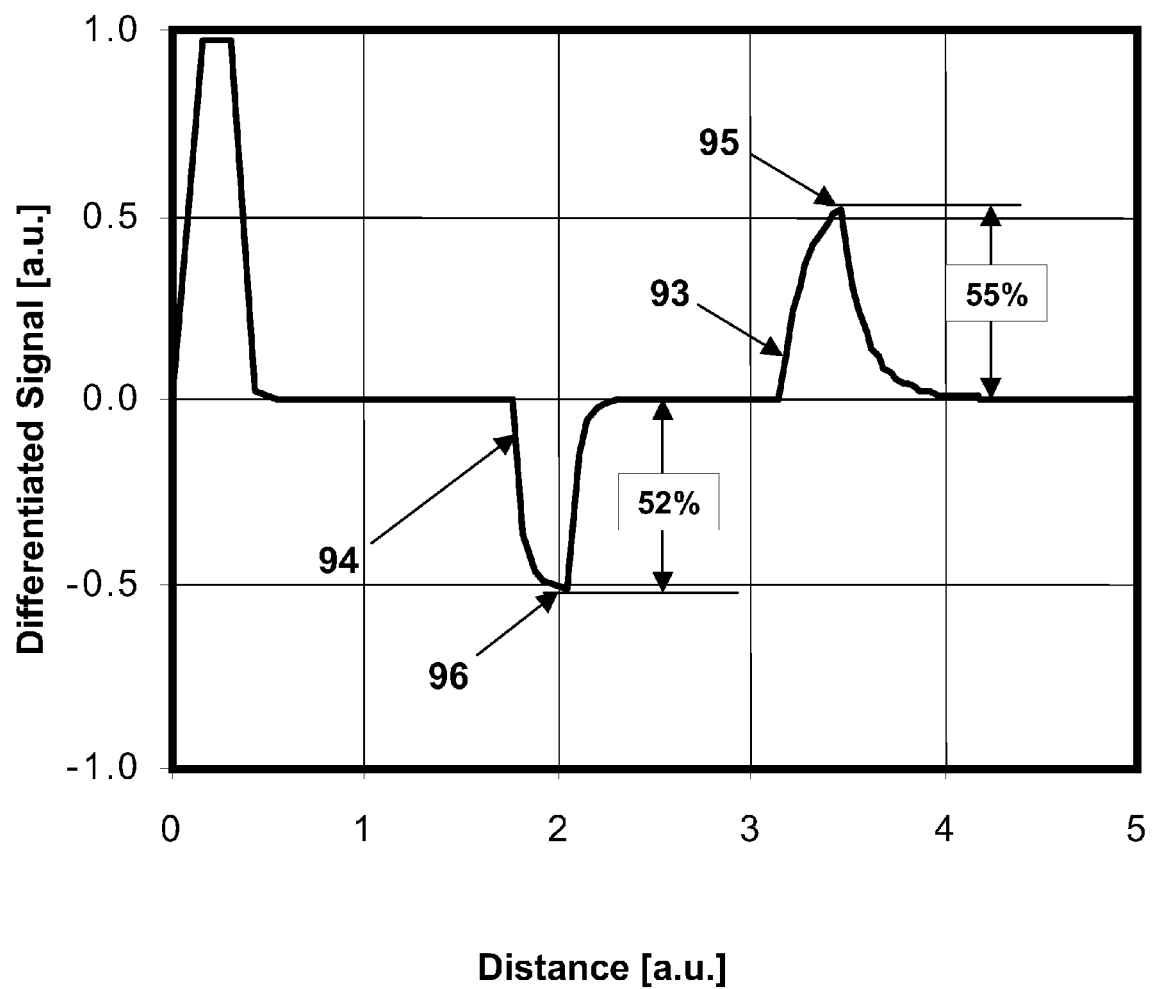

The location of an open or short fault can be determined from a leading edge of the return signal using a suitable algorithm in the microprocessor 29 or an experienced user inspecting a trace on the user interface 32. The leading edge can be defined by a point on the trace where the magnitude of slope of the return signal exceeds 15% of the full amplitude within 5% of the elapsed time (or corresponding distance) from the start time when the launch pulse is injected into the line under test 28. This is illustrated schematically in FIG. 9a where the slope of the return signal equivalent to the differentiated return signal is plotted against distance along the line under test 28. The leading edge 91 of the return signal from an open fault has reached a value of about 35% within 5% of the distance, thereby clearly exceeding the 15% required minimum. Similarly, in FIG. 9b the leading edge 92 of a return signal from a short fault has reached a negative slope value of −70%, again exceeding the required minimum 15% in magnitude. FIG. 9c schematically illustrates the interpretation of the return signal trace for identifying a bridged tap (BT). A negative slope 94 is followed by a positive slope 93, where the negative peak slope 96 and positive peak slope 95 have a magnitude of about 50% of maximum signal amplitude.

A factor limiting the resolution of all TDRs is the sample rate of the ADC 27. Most cables in telecommunications have a propagation velocity of 0.6 to 0.7 that of the speed of light, which works out to about 9 inches per nanosecond in one direction, or 4.5 inches per nanosecond on the return trip. For a system having a 1 nanosecond sampling rate, the best obtainable resolution corresponds to 4.5 inches. However a system having a 1 nanosecond sample resolution is quite expensive and consumes a great deal of power.

For a service technician diagnosing and testing DSL lines at remote geographic locations in a network, a hand-held TDR unit is particularly useful. Such a device however presents certain constraints on electric power consumption supplied by the batteries required in a portable device. Because of this reason many hand held telecommunication/cable TDR testers are generally limited to about a 10 nanosecond time resolution.

In addition, the bandwidth limitations of typical telephone cables may also limit pulse rise and fall times to about the same 10 nanosecond range or greater. A 10 nanosecond time resolution corresponds to about 45 inches in distance resolution. However, by applying numerical interpolation techniques to the raw data with the microprocessor 29, such as a simple linear or spline interpolation, it is possible to estimate the return voltage levels in the spaces between data samples so that the distance to faults can be estimated more accurately than the techniques in current use.

Figure 10A:
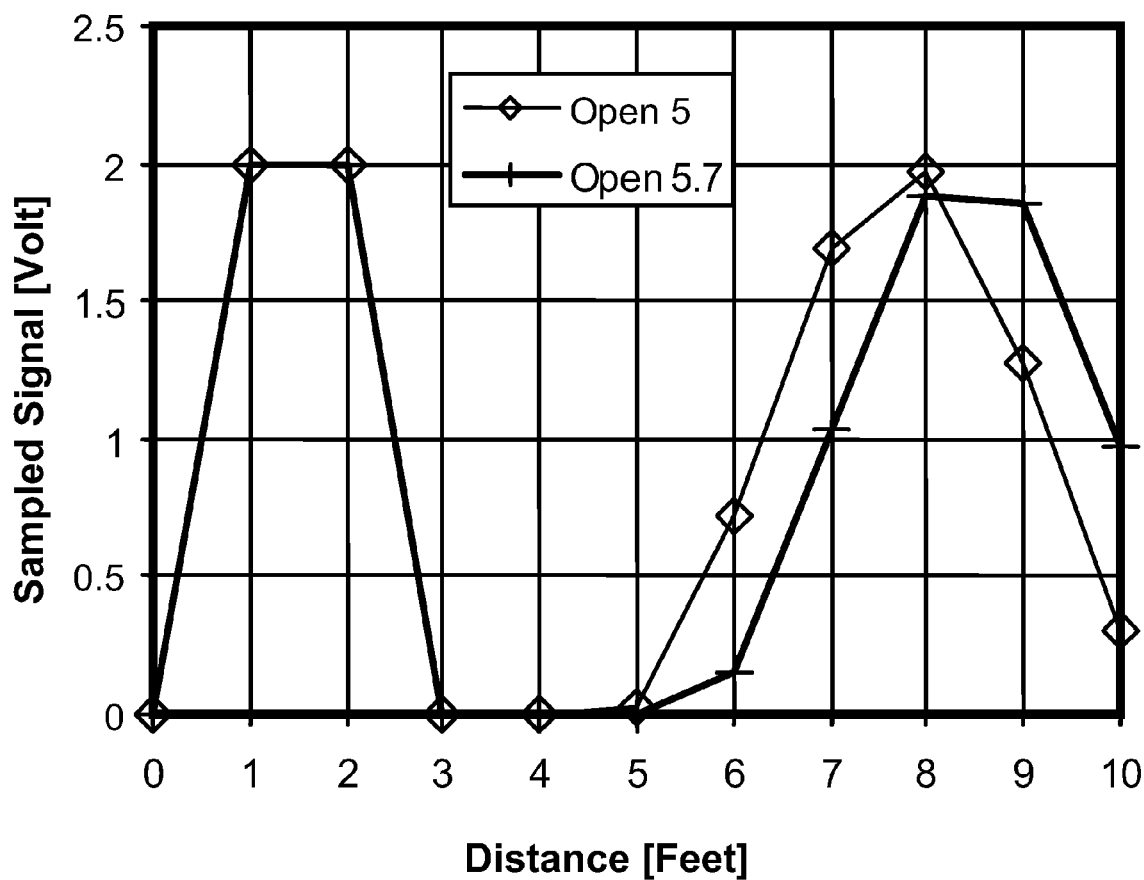
FIG. 10a displays traces of a sampled TDR signal response corresponding to two opens at various distances within a DSL line.

The signal interpolation as applied to TDR is illustrated with the exemplary traces in FIG. 10*a*. Two traces of a sampled voltage signal are shown plotted against distance along the cable under test 28, corresponding to an open fault at distances of 5 feet and 5.7 feet, respectively, from the near-end 28*a*.

Figure 10B:
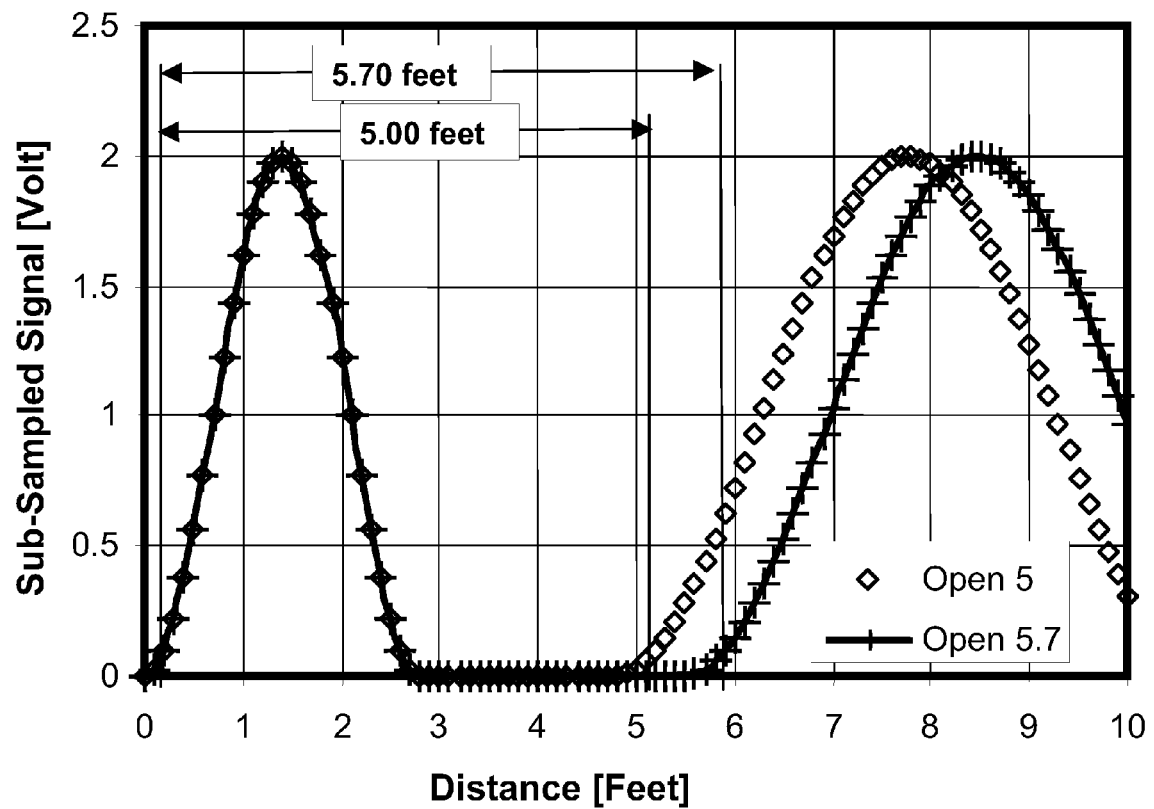
FIG. 10b displays the traces shown in FIG. 10a with sub-sampling by interpolation according the present invention.

With interpolation performed e.g. numerically in the microprocessor 29, many more data points can be obtained, as shown in FIG. 10*b*, which are generated using the same raw data as in FIG. 10*a*. From these additional points, the time (and correspondingly distance) resolution is enhanced to desired levels, while at the same time remaining within the power and speed constraints of the TDR electronics, including the ADC 27 and microprocessor 29.

We claim:

1. A method for using a time domain reflectometer (TDR) to locate a fault in a digital subscriber line (xDSL) having a characteristic impedance, the method comprising:
    a) providing a TDR transmitter and receiver;
    b) transmitting at least one launch pulse into the xDSL with the TDR transmitter and initiating a start time in a timebase;
    c) receiving a return signal trace from the xDSL with the TDR receiver;
    d) amplifying the return signal trace from the xDSL with an adjustable gain amplifier;
    e) digitizing the amplified return signal trace to generate an array of digital samples and sampling time information from the timebase;
    f) recording the array of digital samples and sampling time information; and
    g) differentiating the array of digital samples numerically by selecting pairs of digital samples separated by a time offset that increases, for subsequent pairs from the same launch pulse, as a function of elapsed time from the start time, and generating an arithmetic difference between each selected pair.

2. The method of claim 1, wherein the digitizing is performed with an analog to digital converter (ADC).

3. The method of claim 1, wherein the digitizing is performed at a constant rate.

4. The method of claim 1, further comprising the step of displaying a trace of the differentiated digital samples on a horizontal timebase axis.

5. The method of claim 4, wherein a first section of the horizontal timebase axis comprises a linear scale and a second section of the horizontal timebase axis comprises a logarithmic scale.

6. The method of claim 4, wherein the horizontal timebase axis has units comprising one of time and distance.

7. The method of claim 1, wherein the time offset is increased linearly with the elapsed time from the start time.

8. The method of claim 1, further comprising a step of increasing a gain of the adjustable gain amplifier as a function of elapsed time from the start time.

9. The method of claim 8, further comprising the step of:
    h) interpolating the differentiated digital samples to generate an array of sub-sampled digital samples.

10. The method of claim 9, further comprising the step of analyzing the sub-sampled digital samples for detecting the presence of reflected pulses.

11. The method of claim 1, further comprising the step of:
    h) analyzing the differentiated digital samples for detecting the presence of reflected pulses.

12. The method of claim 1, wherein the recording in step f) is performed using a random access memory of a microprocessor.

13. The method of claim 1, wherein the launch pulse has a pulse width between 10 nanoseconds and 1 millisecond.

14. The method of claim 1, wherein the launch pulse has a pulse width between 16 nanoseconds and 4 microseconds.

* * * * *